US009839083B2

(12) United States Patent
van de Ven et al.

(10) Patent No.: US 9,839,083 B2
(45) Date of Patent: Dec. 5, 2017

(54) SOLID STATE LIGHTING APPARATUS AND CIRCUITS INCLUDING LED SEGMENTS CONFIGURED FOR TARGETED SPECTRAL POWER DISTRIBUTION AND METHODS OF OPERATING THE SAME

(71) Applicant: Cree, Inc., Durham, NC (US)

(72) Inventors: Antony P. van de Ven, Hong Kong (CN); Matthew C. Reynolds, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 86 days.

(21) Appl. No.: 14/281,131

(22) Filed: May 19, 2014

(65) Prior Publication Data

US 2014/0252967 A1 Sep. 11, 2014

Related U.S. Application Data

(63) Continuation-in-part of application No. 13/152,640, filed on Jun. 3, 2011.

(60) Provisional application No. 61/912,846, filed on Dec. 6, 2013.

(51) Int. Cl.

| | |
|---|---|
| ***H05B 37/02*** | (2006.01) |
| ***H05B 39/04*** | (2006.01) |
| ***H05B 41/36*** | (2006.01) |
| ***G05F 1/00*** | (2006.01) |

(Continued)

(52) U.S. Cl.
CPC ....... *H05B 33/083* (2013.01); *H05B 33/0863* (2013.01)

(58) Field of Classification Search
CPC ................................. F21V 9/00; H05B 37/02
USPC .................. 313/1; 362/231, 249.06; 257/98; 315/122, 185 R, 294
See application file for complete search history.

(56) References Cited

U.S. PATENT DOCUMENTS

| | | | |
|---|---|---|---|
| 446,142 | A | 2/1891 | Martin |
| D188,916 | S | 9/1960 | Harling |
| D207,867 | S | 6/1967 | Pettengill |

(Continued)

FOREIGN PATENT DOCUMENTS

| | | | |
|---|---|---|---|
| CN | 101821544 | A | 9/2010 |
| CN | 101889475 | A | 11/2010 |

(Continued)

OTHER PUBLICATIONS

Author: James Frederick Lazar, Title: U.S Utility provisional patent application for source and multiple loads regulator (U.S. Appl. No. 61/431,435), dated Jan. 11, 2011.*

(Continued)

*Primary Examiner* — Douglas W Owens
*Assistant Examiner* — Wei Chan
(74) *Attorney, Agent, or Firm* — Myers Bigel, P.A.

(57) ABSTRACT

A dimmable solid state lighting apparatus can include a plurality of light emitting diode (LED) segments including a first LED segment that can have a targeted spectral power distribution for light emitted from the apparatus that is different than spectral power distributions for other LED segments included in the plurality of LED segments. An LED segment selection circuit can be configured to selectively control current through the plurality of LED segments to shift the light emitted by the apparatus to the targeted spectral power distribution responsive to dimming input.

38 Claims, 10 Drawing Sheets

(51) Int. Cl.
*H01L 33/00* (2010.01)
*H05B 33/08* (2006.01)

(56) References Cited

U.S. PATENT DOCUMENTS 3,560,728 A 2/1971 Atkin
3,638,042 A 1/1972 Studtmann
3,655,988 A 4/1972 Nakamura et al.
3,755,697 A 8/1973 Miller
3,787,752 A 1/1974 Delay
3,913,098 A 10/1975 Nakamura et al.
4,090,189 A 5/1978 Fisler
4,504,776 A 3/1985 Haville
4,717,868 A 1/1988 Peterson
4,743,897 A 5/1988 Perez
4,798,983 A 1/1989 Mori
4,839,535 A 6/1989 Miller
4,841,422 A 6/1989 Groh
4,918,487 A 4/1990 Coulter, Jr.
5,059,788 A 10/1991 Tashiro et al.
5,059,890 A 10/1991 Yoshikawa et al.
5,125,675 A 6/1992 Engelbrecht
5,138,541 A 8/1992 Kano
5,151,679 A 9/1992 Dimmick
5,175,528 A 12/1992 Choi et al.
5,334,916 A 8/1994 Noguchi
5,345,167 A 9/1994 Hasegawa et al.
5,357,120 A 10/1994 Mori
5,384,519 A 1/1995 Gotoh
5,397,938 A 3/1995 Wilhelm et al.
5,467,049 A 11/1995 Kida et al.
5,504,448 A 4/1996 Bennett et al.
5,521,708 A 5/1996 Beretta
5,528,467 A 6/1996 Jiang
5,598,068 A 1/1997 Shirai
5,631,190 A 5/1997 Negley
5,646,760 A 7/1997 Kuijk et al.
5,661,645 A 8/1997 Hochstein
D384,430 S 9/1997 Lecluze
5,736,881 A 4/1998 Ortiz
5,798,520 A 8/1998 Kuijk et al.
5,803,579 A 9/1998 Turnbull et al.
D400,280 S 10/1998 Leen
5,844,377 A 12/1998 Anderson et al.
5,847,340 A 12/1998 Godesa
5,912,477 A 6/1999 Negley
5,912,568 A 6/1999 Kiley
5,929,568 A 7/1999 Eggers
5,941,626 A 8/1999 Yamuro
D418,620 S 1/2000 Grossman
D425,024 S 5/2000 Klaus et al.
6,079,852 A 6/2000 Kamaya et al.
6,150,771 A 11/2000 Perry
6,153,980 A 11/2000 Marshall et al.
6,161,910 A 12/2000 Reisenauer et al.
D437,439 S 2/2001 Tang
6,201,353 B1 3/2001 Chang et al.
6,222,172 B1 4/2001 Fossum et al.
6,264,354 B1 7/2001 Motilal
6,285,139 B1 9/2001 Ghanem
6,323,597 B1 11/2001 Janning
6,329,760 B1 12/2001 Bebenroth
6,329,764 B1 12/2001 van de Ven
6,340,868 B1 1/2002 Lys et al.
6,350,041 B1 2/2002 Tarsa et al.
6,362,578 B1 3/2002 Swanson et al.
6,385,226 B2 5/2002 McMinn et al.
6,388,393 B1 5/2002 Illingworth
6,400,101 B1 6/2002 Biebl et al.
6,411,155 B2 6/2002 Pezzani
6,441,558 B1 8/2002 Muthu et al.
6,498,440 B2 12/2002 Stam et al.
6,501,630 B1 12/2002 Colclaser et al.
6,515,434 B1 2/2003 Biebl
6,528,954 B1 3/2003 Lys et al.
6,556,067 B2 4/2003 Henry
6,577,072 B2 6/2003 Saito et al.
6,586,890 B2 7/2003 Min et al.
6,660,175 B2 7/2003 Baretz et al.
6,614,358 B1 9/2003 Hutchison et al.
6,617,795 B2 9/2003 Bruning
6,630,801 B2 10/2003 Schuurmans
6,636,003 B2 10/2003 Rahm et al.
6,697,130 B2 2/2004 Weindorf et al.
6,724,376 B2 4/2004 Sakura et al.
D490,181 S 5/2004 Redfern
6,747,420 B2 6/2004 Barth et al.
6,753,661 B2 6/2004 Muthu et al.
6,755,550 B1 6/2004 Lackey
6,781,329 B2 8/2004 Mueller et al.
6,784,622 B2 8/2004 Newman, Jr. et al.
6,788,011 B2 9/2004 Mueller et al.
6,791,840 B2 9/2004 Chun
6,808,287 B2 10/2004 Lebens et al.
6,836,081 B2 12/2004 Swanson et al.
6,841,947 B2 1/2005 Berg-johansen
6,864,641 B2 3/2005 Dygert
6,873,203 B1 3/2005 Latham, II et al.
6,885,035 B2 4/2005 Bhat et al.
6,897,624 B2 5/2005 Lys et al.
6,987,787 B1 1/2006 Mick
6,995,518 B2 2/2006 Havlik et al.
6,998,594 B2 2/2006 Gaines et al.
7,014,341 B2 3/2006 King et al.
7,038,399 B2 5/2006 Lys et al.
7,067,995 B2 6/2006 Gunter et al.
7,071,762 B2 7/2006 Xu et al.
7,081,722 B1 7/2006 Huynh et al.
7,088,059 B2 8/2006 McKinney et al.
7,091,874 B2 8/2006 Smithson
7,108,238 B2 9/2006 Gauci
7,109,664 B2 9/2006 Wu
7,119,498 B2 10/2006 Baldwin et al.
7,144,140 B2 12/2006 Sun et al.
7,161,313 B2 1/2007 Piepgras et al.
7,180,487 B2 2/2007 Kamikawa et al.
7,202,608 B2 4/2007 Robinson et al.
7,213,940 B1 5/2007 Van De Ven et al.
7,218,056 B1 5/2007 Harwood
D544,979 S 6/2007 Hartmann et al.
7,226,189 B2 6/2007 Lee et al.
7,233,831 B2 6/2007 Blackwell
7,238,898 B1 7/2007 Czarnecki
7,245,089 B2 7/2007 Yang
7,291,983 B2 11/2007 Hu et al.
D557,853 S 12/2007 Sandell
D558,374 S 12/2007 Sandell
7,307,391 B2 12/2007 Shan
7,344,275 B2 3/2008 Allen et al.
7,352,138 B2 4/2008 Lys et al.
7,358,679 B2 4/2008 Lys et al.
7,385,359 B2 6/2008 Dowling et al.
7,408,308 B2 8/2008 Sawada et al.
D576,964 S 9/2008 Shaner
7,427,838 B2 9/2008 Hosoya
7,432,668 B2 10/2008 Zwanenburg et al.
7,458,706 B1 12/2008 Liu et al.
7,513,639 B2 4/2009 Wang
7,515,128 B2 4/2009 Dowling
7,535,180 B2 5/2009 Negley et al.
7,566,154 B2 7/2009 Gloisten et al.
7,576,496 B2 8/2009 Duggal et al.
7,614,767 B2 11/2009 Zulim et al.
7,614,769 B2 11/2009 Sell
7,628,513 B2 12/2009 Chiu
7,637,635 B2 12/2009 Xiao et al.
D610,291 S 2/2010 Yoshinobu et al.
7,677,767 B2 3/2010 Chyn
7,679,292 B2 3/2010 Allen et al.
D618,376 S 6/2010 Redfern et al.
7,758,223 B2 7/2010 Osawa et al.
7,772,757 B2 8/2010 Kane et al.
7,780,318 B2 8/2010 Xiao et al.
7,804,256 B2 9/2010 Melanson

(56) References Cited

U.S. PATENT DOCUMENTS

| | | | | |
|---|---|---|---|---|
| D625,038 | S | 10/2010 | Yoo | |
| 7,812,553 | B2 | 10/2010 | Kang et al. | |
| 7,821,023 | B2 | 10/2010 | Yuan et al. | |
| 7,821,194 | B2 | 10/2010 | Negley et al. | |
| D627,502 | S | 11/2010 | Zheng et al. | |
| D627,911 | S | 11/2010 | Mo et al. | |
| 7,824,075 | B2 | 11/2010 | Maxik | |
| 7,862,201 | B2 | 1/2011 | Ge et al. | |
| 7,862,214 | B2 | 1/2011 | Trott et al. | |
| D633,099 | S | 2/2011 | Van de Ven et al. | |
| 7,914,902 | B2 | 3/2011 | Kao et al. | |
| D636,921 | S | 4/2011 | Van de Ven et al. | |
| D636,922 | S | 4/2011 | Yoshida et al. | |
| D638,160 | S | 5/2011 | Van de Ven et al. | |
| 7,967,652 | B2 | 6/2011 | Emerson | |
| 7,994,725 | B2 | 8/2011 | Bouchard | |
| 8,008,845 | B2 | 8/2011 | Van de Ven | |
| D646,011 | S | 9/2011 | Rashida | |
| 8,157,422 | B2 | 4/2012 | Paik et al. | |
| 8,235,555 | B2 | 8/2012 | Thomas et al. | |
| 2001/0032985 | A1 | 10/2001 | Bhat et al. | |
| 2002/0027453 | A1 | 3/2002 | Kulhalli et al. | |
| 2002/0043943 | A1 | 4/2002 | Menzer et al. | |
| 2002/0047624 | A1 | 4/2002 | Stam et al. | |
| 2002/0063534 | A1 | 5/2002 | Min | |
| 2002/0097095 | A1 | 7/2002 | Jeon et al. | |
| 2002/0139987 | A1 | 10/2002 | Collins, III et al. | |
| 2004/0036418 | A1 | 2/2004 | Rooke et al. | |
| 2004/0042205 | A1 | 3/2004 | Tanabe et al. | |
| 2004/0046510 | A1 | 3/2004 | Allen | |
| 2004/0105261 | A1* | 6/2004 | Ducharme | H05B 33/0863 362/231 |
| 2004/0208809 | A1 | 10/2004 | Mardon et al. | |
| 2004/0233145 | A1 | 11/2004 | Chiang | |
| 2004/0245946 | A1 | 12/2004 | Halter | |
| 2005/0007164 | A1 | 1/2005 | Callahan, Jr. | |
| 2005/0047134 | A1 | 3/2005 | Mueller et al. | |
| 2005/0057179 | A1 | 3/2005 | Madhani et al. | |
| 2005/0111222 | A1 | 5/2005 | Olsson et al. | |
| 2005/0122065 | A1 | 6/2005 | Young | |
| 2005/0127381 | A1 | 6/2005 | Vitta et al. | |
| 2005/0128750 | A1 | 6/2005 | Ewington et al. | |
| 2005/0169015 | A1 | 8/2005 | Luk et al. | |
| 2005/0174065 | A1 | 8/2005 | Janning | |
| 2005/0242742 | A1 | 11/2005 | Cheang et al. | |
| 2005/0243022 | A1 | 11/2005 | Negru | |
| 2005/0254234 | A1 | 11/2005 | Wang | |
| 2005/0276053 | A1 | 12/2005 | Nortrup et al. | |
| 2005/0280376 | A1 | 12/2005 | Hamidian et al. | |
| 2006/0016960 | A1 | 1/2006 | Morgan et al. | |
| 2006/0049782 | A1 | 3/2006 | Vornsand et al. | |
| 2006/0060882 | A1 | 3/2006 | Ohe et al. | |
| 2006/0081773 | A1 | 4/2006 | Rains, Jr. et al. | |
| 2006/0152172 | A9* | 7/2006 | Mueller | A45D 42/10 315/291 |
| 2006/0153511 | A1 | 7/2006 | Franklin et al. | |
| 2006/0176411 | A1 | 8/2006 | Furukawa | |
| 2006/0221609 | A1 | 10/2006 | Ryan, Jr. | |
| 2006/0226956 | A1 | 10/2006 | Young et al. | |
| 2006/0238465 | A1 | 10/2006 | Kurumisawa et al. | |
| 2006/0244396 | A1 | 11/2006 | Bucur | |
| 2006/0273331 | A1 | 12/2006 | Lim et al. | |
| 2007/0018594 | A1 | 1/2007 | Janning | |
| 2007/0040512 | A1 | 2/2007 | Jungwirth et al. | |
| 2007/0051883 | A1 | 3/2007 | Rains, Jr. et al. | |
| 2007/0096661 | A1 | 5/2007 | Allen | |
| 2007/0108843 | A1 | 5/2007 | Preston et al. | |
| 2007/0115228 | A1 | 5/2007 | Roberts et al. | |
| 2007/0115662 | A1 | 5/2007 | Roberts et al. | |
| 2007/0137074 | A1 | 6/2007 | Van de Ven | |
| 2007/0139920 | A1 | 6/2007 | van de Ven et al. | |
| 2007/0139923 | A1 | 6/2007 | Negley | |
| 2007/0170447 | A1 | 7/2007 | Negley et al. | |
| 2007/0171145 | A1 | 7/2007 | Coleman | |
| 2007/0182338 | A1 | 8/2007 | Shteynberg et al. | |
| 2007/0182346 | A1 | 8/2007 | Shteynberg et al. | |
| 2007/0182347 | A1 | 8/2007 | Shteynberg et al. | |
| 2007/0195023 | A1 | 8/2007 | Kang et al. | |
| 2007/0215027 | A1 | 9/2007 | MacDonald et al. | |
| 2007/0235751 | A1 | 10/2007 | Radkov et al. | |
| 2007/0236911 | A1 | 10/2007 | Negley | |
| 2007/0236920 | A1 | 10/2007 | Snyder | |
| 2007/0247089 | A1 | 10/2007 | Summerland | |
| 2007/0247414 | A1 | 10/2007 | Roberts | |
| 2007/0257623 | A1 | 11/2007 | Johnson et al. | |
| 2007/0257999 | A1 | 11/2007 | Chou | |
| 2007/0263393 | A1 | 11/2007 | Van de Ven | |
| 2007/0267978 | A1 | 11/2007 | Shteynberg et al. | |
| 2007/0267983 | A1 | 11/2007 | Van de Ven | |
| 2007/0273299 | A1 | 11/2007 | Miskin et al. | |
| 2007/0274063 | A1 | 11/2007 | Negley | |
| 2007/0274080 | A1 | 11/2007 | Negley | |
| 2007/0278503 | A1 | 12/2007 | Van de Ven | |
| 2007/0278934 | A1 | 12/2007 | Van de Ven | |
| 2007/0278974 | A1 | 12/2007 | van de Ven | |
| 2007/0279440 | A1 | 12/2007 | Negley | |
| 2007/0279903 | A1 | 12/2007 | Negley | |
| 2007/0280624 | A1 | 12/2007 | Negley | |
| 2007/0285031 | A1 | 12/2007 | Shteynberg et al. | |
| 2008/0024071 | A1 | 1/2008 | Yu | |
| 2008/0030993 | A1 | 2/2008 | Narendran et al. | |
| 2008/0037257 | A1 | 2/2008 | Bolta | |
| 2008/0043464 | A1 | 2/2008 | Ashdown | |
| 2008/0054281 | A1 | 3/2008 | Narendran et al. | |
| 2008/0062070 | A1 | 3/2008 | De Oto et al. | |
| 2008/0084685 | A1 | 4/2008 | Van de Ven | |
| 2008/0084700 | A1 | 4/2008 | Van de Ven | |
| 2008/0084701 | A1 | 4/2008 | Van De Ven et al. | |
| 2008/0088248 | A1 | 4/2008 | Myers | |
| 2008/0089053 | A1 | 4/2008 | Negley | |
| 2008/0089071 | A1 | 4/2008 | Wang | |
| 2008/0094000 | A1 | 4/2008 | Yamamoto et al. | |
| 2008/0094829 | A1 | 4/2008 | Narendran et al. | |
| 2008/0105887 | A1 | 5/2008 | Narendran et al. | |
| 2008/0106895 | A1 | 5/2008 | Van de Ven | |
| 2008/0106907 | A1 | 5/2008 | Trott | |
| 2008/0112168 | A1 | 5/2008 | Pickard | |
| 2008/0112170 | A1 | 5/2008 | Trott | |
| 2008/0112183 | A1 | 5/2008 | Negley | |
| 2008/0116818 | A1* | 5/2008 | Shteynberg | H05B 33/0815 315/192 |
| 2008/0117500 | A1 | 5/2008 | Narendran et al. | |
| 2008/0122376 | A1 | 5/2008 | Lys | |
| 2008/0128718 | A1 | 6/2008 | Sumitani | |
| 2008/0129220 | A1 | 6/2008 | Shtyenberg et al. | |
| 2008/0130283 | A1 | 6/2008 | Chang | |
| 2008/0130285 | A1 | 6/2008 | Negley | |
| 2008/0136313 | A1 | 6/2008 | Van de Ven | |
| 2008/0136331 | A1 | 6/2008 | Schmeikal | |
| 2008/0137347 | A1 | 6/2008 | Trott | |
| 2008/0150440 | A1 | 6/2008 | Hsu | |
| 2008/0157688 | A1 | 7/2008 | Gibboney | |
| 2008/0179602 | A1 | 7/2008 | Negley et al. | |
| 2008/0186704 | A1 | 8/2008 | Chou et al. | |
| 2008/0203946 | A1 | 8/2008 | Ito et al. | |
| 2008/0211415 | A1 | 9/2008 | Altamura | |
| 2008/0215279 | A1 | 9/2008 | Salsbury et al. | |
| 2008/0252197 | A1 | 10/2008 | Li et al. | |
| 2008/0258628 | A1 | 10/2008 | Higley et al. | |
| 2008/0259589 | A1 | 10/2008 | Van de Ven | |
| 2008/0278928 | A1 | 11/2008 | Van de Ven | |
| 2008/0278940 | A1 | 11/2008 | Van de Ven | |
| 2008/0278950 | A1 | 11/2008 | Pickard | |
| 2008/0278952 | A1 | 11/2008 | Trott | |
| 2008/0278957 | A1 | 11/2008 | Pickard | |
| 2008/0304260 | A1 | 12/2008 | van de Ven et al. | |
| 2008/0304261 | A1 | 12/2008 | Van de Ven | |
| 2008/0304269 | A1 | 12/2008 | Pickard | |
| 2008/0309255 | A1 | 12/2008 | Myers et al. | |
| 2009/0015759 | A1 | 1/2009 | Honbo | |
| 2009/0034283 | A1 | 2/2009 | Albright et al. | |
| 2009/0039791 | A1 | 2/2009 | Jones | |
| 2009/0046464 | A1 | 2/2009 | Liu et al. | |
| 2009/0059582 | A1 | 3/2009 | Kulkarni | |

(56) References Cited

U.S. PATENT DOCUMENTS

2009/0079355 A1 3/2009 Zhou et al.
2009/0079357 A1 3/2009 Shteynberg et al.
2009/0079358 A1 3/2009 Shteynberg et al.
2009/0079359 A1 3/2009 Shteynberg et al.
2009/0079360 A1 3/2009 Shteynberg et al.
2009/0079362 A1 3/2009 Shteynberg et al.
2009/0086474 A1 4/2009 Chou
2009/0094000 A1 4/2009 Krishnamurthy et al.
2009/0101930 A1 4/2009 Li
2009/0108269 A1 4/2009 Negley
2009/0140630 A1 6/2009 Kijima et al.
2009/0147517 A1 6/2009 Li et al.
2009/0160363 A1* 6/2009 Negley ................ H05B 33/086 315/294
2009/0161356 A1 6/2009 Negley
2009/0184616 A1* 7/2009 Van De Ven ........ H05B 33/086 313/1
2009/0184662 A1 7/2009 Given et al.
2009/0184666 A1 7/2009 Myers
2009/0189529 A1 7/2009 Negley et al.
2009/0195168 A1 8/2009 Greenfield
2009/0206758 A1 8/2009 Kobilke
2009/0237004 A1 9/2009 Ploquin et al.
2009/0243509 A1 10/2009 Barnett et al.
2009/0251934 A1 10/2009 Shteynberg et al.
2009/0296384 A1 12/2009 Van de Ven et al.
2010/0001648 A1 1/2010 De Clerq et al.
2010/0002440 A1 1/2010 Negley et al.
2010/0026187 A1 2/2010 Kelly et al.
2010/0026208 A1 2/2010 Shteynberg et al.
2010/0045187 A1 2/2010 Shtyenberg et al.
2010/0045210 A1 2/2010 Hariharan
2010/0060130 A1 3/2010 Li
2010/0060175 A1 3/2010 Lethellier
2010/0060181 A1 3/2010 Choi et al.
2010/0067227 A1 3/2010 Budike
2010/0072902 A1 3/2010 Wendt et al.
2010/0079059 A1 4/2010 Roberts et al.
2010/0079076 A1 4/2010 Chang et al.
2010/0079262 A1 4/2010 Van Laanen
2010/0090604 A1 4/2010 Maruyama et al.
2010/0102199 A1 4/2010 Negley
2010/0102697 A1 4/2010 Van de Ven
2010/0103660 A1 4/2010 van de Ven et al.
2010/0103678 A1 4/2010 Van de Ven
2010/0109560 A1 5/2010 Yu et al.
2010/0109570 A1* 5/2010 Weaver .............. H05B 33/0812 315/295
2010/0127282 A1 5/2010 Harbers et al.
2010/0127283 A1 5/2010 van de Ven et al.
2010/0134018 A1* 6/2010 Tziony ................. H05B 33/083 315/122
2010/0135016 A1 6/2010 Ishibashi
2010/0141159 A1 6/2010 Shiu et al.
2010/0177509 A1 7/2010 Pickard
2010/0194274 A1 8/2010 Hoogzaad
2010/0213859 A1 8/2010 Shteynberg et al.
2010/0225220 A1 9/2010 Tanaka et al.
2010/0231135 A1 9/2010 Hum et al.
2010/0246177 A1 9/2010 Van de Ven
2010/0259182 A1* 10/2010 Man ................... H05B 33/0863 315/250
2010/0277084 A1 11/2010 Lee et al.
2010/0308738 A1* 12/2010 Shteynberg ........ H05B 33/0812 315/185 R
2010/0315012 A1 12/2010 Kim et al.
2011/0025217 A1 2/2011 Zhan et al.
2011/0031894 A1 2/2011 Van de Ven
2011/0037413 A1 2/2011 Negley et al.
2011/0057571 A1 3/2011 Ackerman et al.
2011/0062872 A1 3/2011 Jin et al.
2011/0068696 A1 3/2011 van de Ven et al.
2011/0068701 A1 3/2011 van de Ven et al.
2011/0068702 A1 3/2011 van de Ven et al.
2011/0074265 A1 3/2011 Van de Ven
2011/0074289 A1 3/2011 Van de Ven
2011/0075411 A1 3/2011 Van de Ven et al.
2011/0075414 A1 3/2011 Van de Ven et al.
2011/0075422 A1 3/2011 Van de Ven et al.
2011/0075423 A1 3/2011 Van de Ven
2011/0084614 A1 4/2011 Eisele et al.
2011/0109228 A1 5/2011 Shimomura et al.
2011/0115394 A1 5/2011 Shteynberg et al.
2011/0115407 A1* 5/2011 Wibben ............. H05B 33/0815 315/294
2011/0115411 A1 5/2011 Shteynberg et al.
2011/0121754 A1 5/2011 Shteynberg et al.
2011/0019984 A1 8/2011 Van de Ven
2011/0210678 A1* 9/2011 Grajcar .............. H05B 33/0809 315/192
2011/0211351 A1 9/2011 Van de Ven
2011/0227484 A1 9/2011 Huynh
2011/0227485 A1 9/2011 Huynh
2011/0227489 A1 9/2011 Huynh
2011/0227490 A1 9/2011 Huynh
2011/0254525 A1* 10/2011 Gaknoki ............ H05B 33/0815 323/283
2011/0273102 A1 11/2011 van de Ven et al.
2011/0279061 A1 11/2011 Lee et al.
2012/0091920 A1 4/2012 Yang
2012/0099321 A1 4/2012 Scott et al.
2012/0104953 A1* 5/2012 Chobot .............. H05B 33/0872 315/153
2012/0153844 A1 6/2012 Chobot
2012/0176826 A1* 7/2012 Lazar .................... H02M 3/158 363/126
2012/0201025 A1 8/2012 Cash
2012/0306375 A1 12/2012 van de Ven
2013/0002167 A1 1/2013 van de Ven et al.
2013/0026923 A1 1/2013 Athalye et al.
2013/0069561 A1 3/2013 Melanson et al.
2013/0077299 A1 3/2013 Hussell et al.
2013/0082610 A1 4/2013 Bradford
2013/0154508 A1 6/2013 Gilliom
2013/0207559 A1 8/2013 Ferrier
2013/0278157 A1 10/2013 Radermacher
2016/0066381 A1* 3/2016 Despesse ........... H05B 33/0824 315/191

FOREIGN PATENT DOCUMENTS

EP 1 020 935 A2 7/2000
EP 1 594 348 A2 11/2005
EP 1 881 259 A1 1/2008
JP 59-113768 A 6/1984
JP 4 196359 A 7/1992
JP 3412702 6/2003
JP 2003-273404 A 9/2003
JP 2005-310997 A 11/2005
JP 2006-103404 A 4/2006
JP 2006-332022 A 12/2006
JP 2007-059260 3/2007
JP 2007-110075 4/2007
JP 2008-059811 3/2008
JP 2008-125339 A 5/2008
JP 2008-205357 A 9/2008
JP 2008-226473 9/2008
JP 2008-544569 A 12/2008
JP 2009-016280 A 1/2009
JP 2009-049010 A 3/2009
JP 2010-008694 1/2010
JP 2010503164 A 1/2010
JP 2010-092776 A 4/2010
JP 2011-508939 A 3/2011
KR 10-2010-0040242 4/2010
KR 10-2011-0028204 A 3/2011
WO WO 03/096761 11/2003
WO WO 2003/096761 A1 11/2003
WO WO 2006/007388 A1 1/2006
WO WO 2006/018604 A1 2/2006
WO WO 2007/023454 A1 3/2007
WO WO 2008/036873 3/2008

(56) References Cited

FOREIGN PATENT DOCUMENTS

| | | | |
|---|---|---|---|
| WO | WO 2008/051957 | | 5/2008 |
| WO | WO 2008/061082 | | 5/2008 |
| WO | WO 2008/129485 | A1 | 10/2008 |
| WO | WO 2008/129504 | A1 | 10/2008 |
| WO | WO 2009/049019 | | 4/2009 |
| WO | WO 2010/012999 | | 2/2010 |
| WO | WO 2011/037752 | A2 | 3/2011 |

OTHER PUBLICATIONS

Author: James Frederick Lazar, Title: U.S Utility provisional patent application for source and multiple loads regulator (U.S. Appl. No. 61/431,435), dated Jan. 11, 2011, (Drawings).*
U.S. Appl. No. 12/328,144, filed Dec. 4, 2008, Chobot.
U.S. Appl. No. 12/328,115, filed Dec. 4, 2008, Chobot.
U.S. Appl. No. 11/854,744, filed Sep. 13, 2007, Myers.
U.S. Appl. No. 60/844,325, filed Sep. 13, 2006, Myers.
"*ASSIST Recommends . . . LED Life for General Lighting: Definition of Life*", vol. 1, Issue 1, Feb. 2005.
"*Bright Tomorrow Lighting Competition* (*L Prize*™)", May 28, 2008, Document No. 08NT006643.
"*Energy Star® Program Requirements for Solid State Lighting Luminaires, Eligibility Criteria—Version 1.1*", Final: Dec. 19, 2008.
Application Note: CLD-APO6.006, entitled *Cree® XLamp® XR Family & 4550 LED Reliability*, published at cree.com/xlamp, Sep. 2008.
Bulborama, Lighting Terms Reference and Glossary, http://www.bulborama.com/store/lightingreferenceglossary-13.html, 6 pages.
Chinese First Office Action Corresponding to Chinese Patent Application No. 201180022813.5; dated Feb. 25, 2014; Foreign Text, 16 Pages; English Translation Thereof, 5 Pages.
Chinese Office Action Corresponding to Chinese Patent Application No. 2010-80053242.7; dated Nov. 27, 2013, Foreign Text, 16 Pages, English Translation, 35 Pages.
DuPont "*DuPont™ Diffuse Light Reflector*", Publication K-20044, May 2008, 2 pages.
European Extended Search Report Corresponding to European Application No. 11777867; Dated May 13, 2014; 7 Pages.
EXM020, Multi-Channel 160W LED Driver, Rev. 2.0 Nov. 2010, 13 pages, www.exclara.com.
EXM055, 14.8W Dimmable LED Ballast, Rev. 0.7, Mar. 11, 2011, 10 pages, www.exclara.com.
EXM057, 14.5W Dimmable LED Ballast, Rev. 0.5, Mar. 11, 2011, 8 pages, www.exclara.com.
Extended European Search Report corresponding to European Patent Application No. 10819249; dated Mar. 27, 2014, 8 pages.
Furukawa Electric Co., Ltd., Data Sheet, "*New Material for Illuminated Panels Microcellular Reflective Sheet MCPET*", updated Apr. 8, 2008, 2 pages.
Global Patent Literature Text Search Corresponding to PCT Application No. PCT/US2011/38995; dated Sep. 8, 2011; 7 pages.
Illuminating Engineering Society Standard LM-80-08, entitled "*IES Approved Method for Measuring Lumen Maintenance of LED Light Sources*", Sep. 22, 2008, ISBN No. 978-0-87995-227-3.
International Preliminary Report on Patentability Corresponding to International Application No. PCT/US2010/048567; dated Apr. 5, 2012; 10 pages.
International Preliminary Report on Patentability corresponding to International Application No. PCT/US2010/029897; dated Apr. 27, 2011; 14 pages.
International Preliminary Report on Patentability Corresponding to International Application No. PCT/US2012/040189; dated Dec. 19, 2013; 13 Pages.
International Search Report and the Written Opinion of the International Searching Authority Corresponding to International Application No. PCT/US2011/033736; dated Jul. 7, 2011; 10 pages.
International Search Report and the Written Opinion of the International Searching Authority Corresponding to International Application No. PCT/US2011/038995; dated Sep. 16, 2011; 9 pages.
International Search Report and Written Opinion Corresponding to International Application No. PCT/US2012/039984; dated Nov. 30, 2012; 10 Pages.
International Search Report and Written Opinion Corresponding to International Application No. PCT/US2012/064434; dated Jan. 25, 2013; 11 Pages.
International Search Report and Written Opinion Corresponding to International Application No. PCT/US2012/040189; dated Aug. 20, 2012; 15 Pages.
International Search Report and Written Opinion for PCT Application No. PCT/US12/47643 dated Oct. 25, 2012.
International Search Report Corresponding to International Application No. PCT/US2010/049581; dated Nov. 23, 2010; 3 pages.
International Search Report Corresponding to International Application No. PCT/US11/54846; dated Jan. 23, 2012; 13 pages.
International Search Report Corresponding to International Application No. PCT/US2010/048567; Dated Oct. 29, 2010.
Japanese Office Action Corresponding to Japanese Patent Application No. 2013-509109; Dispatch Date: Sep. 17, 2013; Foreign Text, 2 Pages, English Translation, 3 Pages.
Japanese Office Action Corresponding to Japanese Patent Application No. 2012-530920; dated May 28, 2014; Foreign Text, 3 Pages; English Translation Thereof, 2 Pages.
Kim et al. "Strongly Enhanced Phosphor Efficiency in GaInN White Light-Emitting Diodes Using Remote Phosphor Configuration and Diffuse Reflector Cup" *Japanese Journal of Applied Physics* 44(21):L649-L651 (2005).
LEDs Magazine, Press Release May 23, 2007, "*Furukawa America Debuts MCPET Reflective Sheets to Improve Clarity, Efficiency of Lighting Fixtures*", downloaded Jun. 25, 2009 from http://www.ledsmagazine.com/press/15145, 2 pages.
MCPET—Microcellular Reflective Sheet Properties, http://www.trocellen.com, downloaded Jun. 25, 2009, 2 pages.
Notification Concerning Transmittal of International Preliminary Report on Patentability, Application No. PCT/US2010/048225, dated Feb. 27, 2014, 9 Pages.
Notification Concerning Transmittal of International Preliminary Report on Patentability, Application No. PCT/US2012/054869, dated Mar. 27, 2014, 8 pages.
Notification Concerning Transmittal of International Preliminary Report on Patentability, Application No. PCT/US2012/054888, dated Mar. 27, 2014, 10 pages.
Notification of Transmittal of the International Search Report and the Written Opinion of the International Searching Authority, or the Declaration; International Search Report; and Written Opinion of the International Searching Authority, PCT Application No. PCT/US2010/037608, dated Jul. 30, 2010.
Notification of Transmittal of the International Search Report and the Written Opinion of the International Searching Authority, or the Declaration, International Search Report, and Written Opinion of the International Searching Authority, PCT International Application No. PCT/US2006/011820, dated Aug. 7, 2006.
Notification of transmittal of the international search report and the written opinion of the international searching authority, or declaration, PCT/US2010/029897, dated Jun. 23, 2010.
Notification of Transmittal of the International Search Report and the Written Opinion of the International Searching Authority, or the Declaration; International Search Report; Written Opinion of the International Searching Authority; Corresponding to International Application No. PCT/US2010/048225; Dated Nov. 4, 2010; 11 pages.
Philips Lumileds, Technology White Paper: "Understanding power LED lifetime analysis", downloaded from http://www.philipslumileds.com/pdfs/WP12.pdf, Document No. WP12, Last Modified May 22, 2007.
Rensselaer Polytechnic Institute, "What is color consistency?". NLPIP, Lighting Research Center, vol. 8, Issue 1, Oct. 2004, 3 Pages, Retrieved from http://www.lrc.rpi.edu/programs/nlpip/lightinganswers/lightsources/whatisColorConsistency.asp.
Sutardja, P., "Design for High Quality and Low Cost SSL with Power Factor Correction", Marvell Semiconductor Inc. Jul. 2011. 16 pages.

(56) References Cited

OTHER PUBLICATIONS

Chinese First Office Action and Search Report Corresponding to Chinese Patent Application No. 201280034828.8; dated Jan. 5, 2015; Foreign Text, 14 Pages, English Translation Thereof, 9 Pages.
International Search Report and Written Opinion Corresponding to International Application No. PCT/US2014/068534; dated Mar. 4, 2015; 15 Pages.
European Search Report Corresponding to Patent Application No. 12 79 2795; Dated Nov. 11, 2015; 7 Pages.
Japanese Final Rejection Corresponding to Patent Application No. 2014-513696; dated Oct. 14, 2015; Foreign Text, 2 Pages, English Translation Thereof, 2 Pages.
Korean Notice of Preliminary Rejection Corresponding to Patent Application No. 10-2012-7029011; Foreign Text, 7 Pages, English Translation Thereof, 5 Pages.
Korean Notice of Preliminary Rejection Corresponding to Korean Application No. 10-2012-7029011; dated May 10, 2016; Foreign Text, 6 pages, English Translation, 5 pages.
International Preliminary Report on Patentability Corresponding to International Application No. PCT/US2014/068354; dated Jun. 16, 2016; 13 Pages.
Notice of Preliminary Rejection dated Jan. 16, 2017 issued for corresponding Korean Application No. 10-2012-7029011 (including English translation).

* cited by examiner

455

| STATE | LED STRING VOLTAGE |
|---|---|
| 000 | 0V |
| 001 | 20V |
| 010 | 40V |
| 011 | 60V |
| 100 | 80V |
| 101 | 100V |
| 110 | 120V |
| 111 | 140V |

SOLID STATE LIGHTING APPARATUS AND CIRCUITS INCLUDING LED SEGMENTS CONFIGURED FOR TARGETED SPECTRAL POWER DISTRIBUTION AND METHODS OF OPERATING THE SAME

CROSS-REFERENCE TO RELATED APPLICATION

The present application is a continuation-in-part of and claims priority to U.S. patent application Ser. No. 13/152,640; filed Jun. 3, 2011, entitled Systems and METHODS FOR CONTROLLING SOLID STATE LIGHTING DEVICES AND LIGHTING APPARATUS INCORPORATING SUCH SYSTEMS AND/OR METHODS, and claims priority to U.S. Provisional Patent Application No. 61/912,846; filed Dec. 6, 2013, entitled SOLID STATE LIGHTING APPARATUS AND CIRCUITS INCLUDING LED SEGMENTS CONFIGURED FOR TARGETED SPECTRAL POWER DISTRIBUTION AND METHODS OF OPERATING THE SAME, the disclosures of which are hereby incorporated herein by reference in their entireties.

FIELD OF THE INVENTION

The invention relates to the field of lighting in general, and more particularly, to solid state lighting.

BACKGROUND

Solid state lighting arrays are used for a number of lighting applications. For example, solid state lighting panels including arrays of solid state light emitting devices have been used as direct illumination sources, for example, in architectural and/or accent lighting. A solid state light emitting device may include, for example, a packaged light emitting device including one or more light emitting diodes (LEDs), which may include inorganic LEDs, which may include semiconductor layers forming p-n junctions and/or organic LEDs (OLEDs), which may include organic light emission layers.

Visible light may include light having many different wavelengths. The apparent color of visible light can be illustrated with reference to a two dimensional chromaticity diagram, such as the 1931 International Conference on Illumination (CIE) Chromaticity Diagram illustrated in FIG. 1, and the 1976 CIE u'v' Chromaticity Diagram shown in FIG. 1B, which is similar to the 1931 Diagram but is modified such that similar distances on the 1976 u'v' CIE Chromaticity Diagram represent similar perceived differences in color. These diagrams provide useful reference for defining colors as weighted sums of colors.

As shown in FIG. 1, colors on a 1931 CIE Chromaticity Diagram are defined by x and y coordinates (i.e., chromaticity coordinates, or color points) that fall within a generally U-shaped area. Colors on or near the outside of the area are saturated colors composed of light having a single wavelength, or a very small wavelength distribution. Colors on the interior of the area are unsaturated colors that are composed of a mixture of different wavelengths. White light, which can be a mixture of many different wavelengths, is generally found near the middle of the diagram, in the region labeled 100 in FIG. 1. There are many different hues of light that may be considered "white," as evidenced by the size of the region 100. For example, some "white" light, such as light generated by sodium vapor lighting devices, may appear yellowish in color, while other "white" light, such as light generated by some fluorescent lighting devices, may appear more bluish in color.

Light that generally appears green is plotted in the regions 101, 102 and 103 that are above the white region 100, while light below the white region 100 generally appears pink, purple or magenta. For example, light plotted in regions 104 and 105 of FIG. 1 generally appears magenta (i.e., red-purple or purplish red).

It is further known that a binary combination of light from two different light sources may appear to have a different color than either of the two constituent colors. The color of the combined light may depend on the relative intensities of the two light sources. For example, light emitted by a combination of a blue source and a red/orange source may appear purple or magenta to an observer. Similarly, light emitted by a combination of a blue source and a yellow source may appear white to an observer.

Also illustrated in FIG. 1 is the Planckian locus 106, which corresponds to the location of color points of light emitted by a black-body radiator that is heated to various temperatures. In particular, FIG. 1 includes temperature listings along the Planckian locus. These temperature listings show the color path of light emitted by a black-body radiator that is heated to such temperatures. As a heated object becomes incandescent, it first glows reddish, then yellowish, then white, and finally bluish, as the wavelength associated with the peak radiation of the black-body radiator becomes progressively shorter with increased temperature. Illuminants which produce light which is on or near the Planckian locus can thus be described in terms of their correlated color temperature (CCT).

The chromaticity of a particular light source may be referred to as the "color point" of the source. For a white light source, the chromaticity may be referred to as the "white point" of the source. The white point of a white light source may fall along the Planckian locus. Accordingly, a white point may be identified by a correlated color temperature (CCT) of the light source. White light typically has a CCT of between about 2000 K and 10000 K. White light with a CCT of 3000 may appear yellowish in color, while light with a CCT of 8000 K may appear more bluish in color. Color coordinates that lie on or near the Planckian locus at a color temperature between about 2500 K and 8000 K may yield pleasing white light to a human observer.

"White" light also includes light that is near, but not directly on the Planckian locus. A Macadam ellipse can be used on a 1931 CIE Chromaticity Diagram to identify color points that are so closely related that they appear the same, or substantially similar, to a human observer. A Macadam ellipse is a closed region around a center point in a two-dimensional chromaticity space, such as the 1931 CIE Chromaticity Diagram, that encompasses all points that are visually indistinguishable from the center point. A seven-step Macadam ellipse captures points that are indistinguishable to an ordinary observer within seven standard deviations, a ten step Macadam ellipse captures points that are indistinguishable to an ordinary observer within ten standard deviations, and so on. Accordingly, light having a color point that is within about a ten step Macadam ellipse of a point on the Planckian locus may be considered to have a substantially similar color as the point on the Planckian locus.

The ability of a light source to accurately reproduce color in illuminated objects is typically characterized using the color rendering index (CRI). In particular, CRI is a relative measurement of how the color rendering properties of an illumination system compare to those of a reference illuminator, with a reference illuminator for a CCT of less than 5000K being a black-body radiator. For CCT of 5000K and above, the reference illuminator is a spectrum defined by the CIE which is similar to the spectrum of sunlight at the earth's surface. The CRI equals 100 if the color coordinates of a set of test colors being illuminated by the illumination system are the same as the coordinates of the same test colors being irradiated by the reference illuminator. Daylight has the highest CRI (of 100), with incandescent bulbs being relatively close (about 95), and fluorescent lighting being less accurate (70-85).

Generally speaking, incandescent bulbs tend to produce more natural-appearing illumination than other types of conventional lighting devices. In particular, incandescent bulbs typically go from a color temperature of about 2700K at full brightness to a color temperature of about 2000 k at 5% brightness and to a color temperature of about 1800K at about 1% brightness. This compares favorably with daylight, which varies from about 6500K at midday to about 2500 k at sunrise and sunset. Research indicates that people tend to prefer warmer color temperatures at low brightness levels and in intimate settings.

In illumination applications, it is often desirable to provide a lighting source that generates a light with a color behavior that approximates the behavior of incandescent lighting. LED-lighting units have been proposed that may be coupled to an ac dimmer circuit (such as a rheostat or phase cut dimming circuit) and approximate the lighting variation of a conventional incandescent light as the dimmer circuit increases or decreases the brightness of the generated light, as described in U.S. Pat. No. 7,038,399 to Lys et al.

One difficulty with solid state lighting systems including multiple solid state devices, is that the manufacturing process for LEDs typically results in variations between individual LEDs. This variation is typically accounted for by binning, or grouping, the LEDs based on brightness, and/or color point, and selecting only LEDs having predetermined characteristics for inclusion in a solid state lighting system. LED lighting devices may utilize one bin of LEDs, or combine matched sets of LEDs from different bins, to achieve repeatable color points for the combined output of the LEDs.

One technique to tune the color point of a lighting fixture is described in commonly assigned United States Patent Publication No. 2009/0160363, the disclosure of which is incorporated herein by reference. The '363 application describes a system in which phosphor converted LEDs and red/orange LEDs are combined to provide white light. The ratio of the various mixed colors of the LEDs is set at the time of manufacture by measuring the output of the light and then adjusting string currents to reach a desired color point. The current levels that achieve the desired color point are then fixed for the particular lighting device. LED lighting systems employing feedback to obtain a desired color point are described in U.S. Publication Nos. 2007/0115662 and 2007/0115228 and the disclosures of which are incorporated herein by reference.

It is known to provide a solid state lighting apparatus, such as one including Light Emitting Diodes (LEDs), that operates in response to a rectified ac voltage. In some conventional lighting devices, segments of the LED string can be separately biased so that as the magnitude of the rectified ac voltage increases, additional segments of the LED string can be forward biased so that light is provided in a sequentially increasing manner. Moreover, as the magnitude of the rectified ac voltage signal decreases (i.e. passes 90 degrees of phase) the separate LED segments are deactivated in reverse order.

SUMMARY

Embodiments according to the present invention can provide a solid-state lighting apparatus and circuits including LED segments configured for targeted spectral power distribution methods of operating the same. Pursuant to these embodiments, a dimmable solid state lighting apparatus can include a plurality of light emitting diode (LED) segments including a first LED segment that can have a targeted spectral power distribution for light emitted from the apparatus that is different than spectral power distributions for other LED segments included in the plurality of LED segments. An LED segment selection circuit can be configured to selectively control current through the plurality of LED segments to shift the light emitted by the apparatus to the targeted spectral power distribution responsive to dimming input.

DETAILED DESCRIPTION OF EMBODIMENTS ACCORDING TO THE INVENTION

Figure 1:
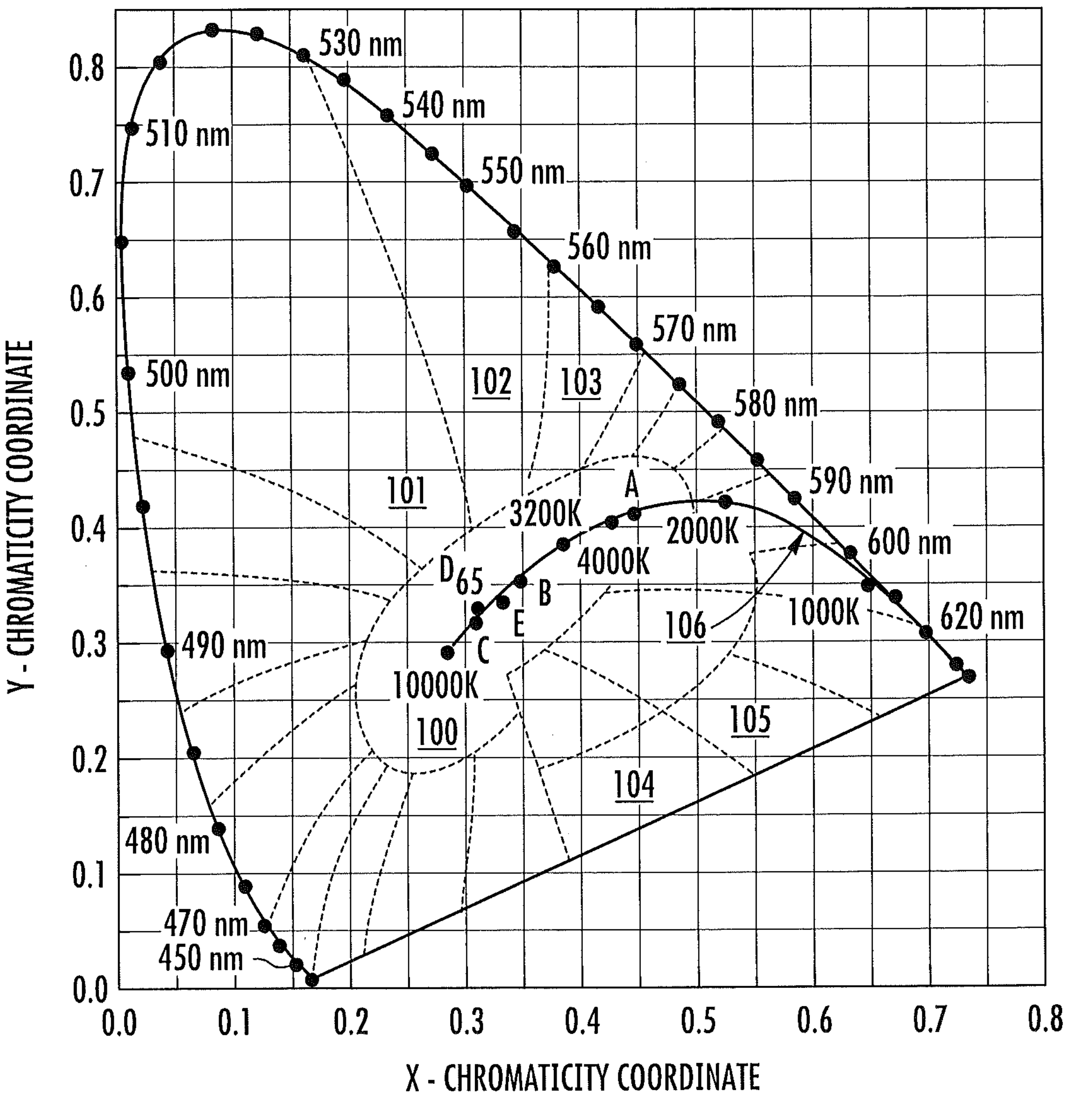
FIG. 1 is a chromaticity diagram illustrating a Planckian locus using x and y chromaticity coordinates.

Embodiments of the present inventive subject matter are described more fully hereinafter with reference to the accompanying drawings, in which embodiments of the present inventive subject matter are shown. This present inventive subject matter may, however, be embodied in many different forms and should not be construed as limited to the embodiments set forth herein. Rather, these embodiments are provided so that this disclosure will be thorough and complete, and will fully convey the scope of the present inventive subject matter to those skilled in the art. Like numbers refer to like elements throughout.

The expression "lighting apparatus", as used herein, is not limited, except that it indicates that the device is capable of emitting light. That is, a lighting apparatus can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., back light poster, signage, LCD displays), bulb replacements (e.g., for replacing ac incandescent lights, low voltage lights, fluorescent lights, etc.), lights used for outdoor lighting, lights used for security lighting, lights used for exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting, work lights, etc., mirrors/vanity lighting, or any other light emitting device.

The following description of some embodiments of the inventive subject matter refers to "light emitting devices," (LED) which may include, but is not limited to, solid-state lighting devices, such as light emitting diode devices. As used herein, "LED" includes, but is not limited to, direct-emission devices that produce light when a voltage is applied across a PN junction thereof, as well as combinations of such direct-emission devices with luminescent materials, such as phosphors that emit visible-light radiation when excited by a source of radiation, such as a direct-emission device.

In some embodiments, the present invention can be utilized in connection with bypass circuits, using the current sensed in the LED string and the temperature associated therewith, as described in co-pending and commonly assigned U.S. patent application Ser. No. 12/566,195 entitled "Solid State Lighting Apparatus with Controllable Bypass Circuits and Methods of Operating Thereof", co-pending and commonly assigned U.S. patent application Ser. No. 12/704,730 entitled "Solid State Lighting Apparatus with Compensation Bypass Circuits and Methods of Operation Thereof" and co-pending and commonly assigned U.S. patent application Ser. No. 12/566,142 entitled "Solid State Lighting Apparatus with Configurable Shunts", the disclosures of which are incorporated herein by reference. Temperature compensation is described in co-pending and commonly assigned U.S. patent application Ser. No. 13/565,166, (P1513), entitled "Temperature Curve Compensation Offset" the disclosure of which is incorporated herein by reference.

Figure 2A:
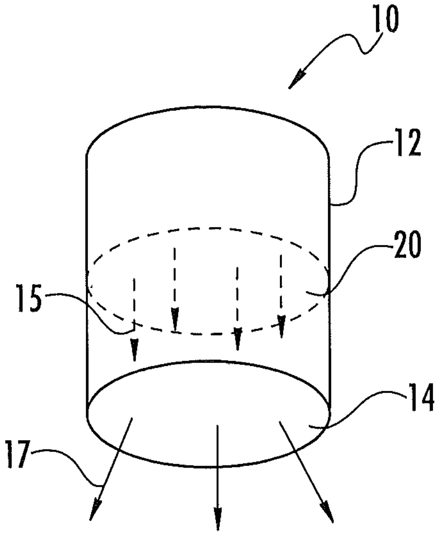
FIGS. 2A and 2B illustrate a solid state lighting apparatus in some embodiments according to the invention.
Figure 2B:
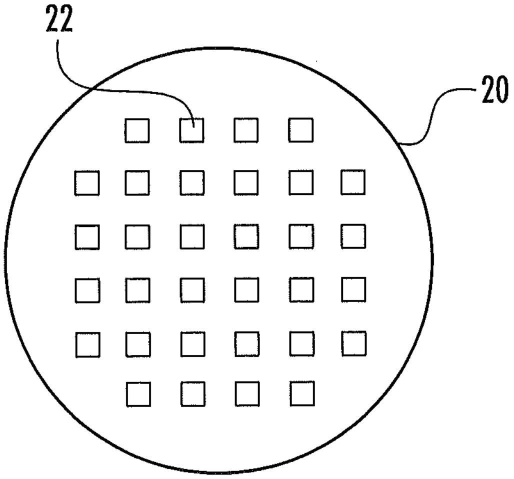

Referring to FIGS. 2A and 2B, a lighting apparatus 10 according to some embodiments is illustrated. The lighting apparatus 10 shown in FIGS. 2A and 2B is a "recessed downlight" or "can" lighting fixture that may be suitable for use in general illumination applications as a down light or spot light. However, it will be appreciated that a lighting apparatus according to some embodiments may have a different form factor. For example, a lighting apparatus according to some embodiments can have the shape of a conventional light bulb, a pan or tray light, an automotive headlamp, or any other suitable form.

The lighting apparatus 10 generally includes a can shaped outer housing 12 in which a lighting panel 20 is arranged. In the embodiments illustrated in FIGS. 2A and 2B, the lighting panel 20 has a generally circular shape so as to fit within an interior of the cylindrical housing 12. Light is generated by solid state lighting devices (LEDs) 22, which are mounted on the lighting panel 20, and which are arranged to emit light 15 towards a diffusing lens 14 mounted at the end of the housing 12. Diffused light 17 is emitted through the lens 14. In some embodiments, the lens 14 may not diffuse the emitted light 15, but may redirect and/or focus the emitted light 15 in a desired near-field or far-field pattern. The LEDs 22 may include LEDs of different chromaticities that may be selectively controlled to produce a desired intensity, correlated color temperature (CCT) and/or color rendering index (CRI) using various techniques discussed herein.

It will be understood that the term LED "segment" refers to a separately switched portion of an LED string. A segment can include at least one LED device, which can itself include a number of serially connected epi junctions used to provide a device that has a particular forward voltage, such as 3V, 6V, 9V, etc. where a single epi junction may have a forward voltage of about 1.5 volts. Each segment may include multiple LEDs that are connected in various parallel and/or serial arrangements. The segments LEDs may be configured in a number of different ways and may have various compensation circuits associated therewith, as discussed, for example, in commonly assigned co-pending U.S. application Ser. No. 13/235,103. U.S. application Ser. No. 13/235,127.

It will be understood that the term "targeted" can include configurations of the LED segments that are configured to provide a pre-defined lighting characteristic that is a specified parameter for the lighting apparatus. For example, a targeted spectral power distribution can be a spectral power distribution that is specified for the light provided by the apparatus as a result of dimming the light. In particular, the targeted spectral power distribution can describe the characteristic of the light that is generated at a particular dimming level. In some embodiments according to the invention, the targeted spectral power distribution can be specified on the packaging of the lighting apparatus or otherwise in conjunction with the advertising or marketing of the lighting apparatus. Furthermore, the targeted spectral power distribution can be associated with the lighting characteristics of two or more specified dimming levels, such as a low light level and a higher light level. Accordingly the targeted spectral power distribution can be provided as the light shifts from "full on" to more dimming as well a shift in the reverse direction toward "full on."

Furthermore, an LED can be characterized as having a particular spectral power distribution, which can affect various light characteristics of the light emitted by the LED. It will be understood that a spectral power distribution can be used to express the power per unit area per unit wavelength of an illumination (radiant exitance), or more generally, the per wavelength contribution to any radiometric quantity (such as radiant energy, radiant flux, radiant intensity, radiance, irradiance, radiant exitance, and/or radiosity, etc.). It will be further understood that, a spectral power distribution may be normalized in some manner, such as, to unity at 555 or 560 nanometers, coinciding with the peak of the eye's luminosity function, in addition to the light characteristics described herein, such as CRI, CCT, CX and CY, etc.

The spectral power distribution of the combinations of LED segments can create an overall spectral power distribution for the lighting apparatus which can change based on which of the LED segments are on and for how long each of the LED segments is on. This timing associated with the LED segments having associated spectral power distributions can affect the lighting characteristics of the lighting apparatus including the Color Quality Scale (CQS), the dominant wavelength, the GAI, peak wavelength, the S/P ratio, the nonlinear brightness, the luminous efficacy, and the like.

It will be understood that Color Quality Scale (CQS) is a quantitative measure of the ability of a light source to reproduce colors of illuminated objects, which was developed by The National Institute of Standards and Technology (NIST). The characteristic of "dominant wavelength" (and complementary wavelength) are ways of describing non-spectral (polychromatic) light mixtures in terms of the spectral (monochromatic) light that evokes an identical perception of hue. For example, in FIG. 1, a straight line drawn between the point for a given color and the point for the color of the illuminant can be extrapolated so that it intersects the perimeter of the space in two points. The point of intersection nearer to the color in question can indicate the dominant wavelength of the color as the wavelength of the spectral color at that intersection point. The point of intersection on the opposite side of the color space gives the complementary wavelength, which when added to the color in question in the right proportion will yield the color of the illuminant. CQS is further described in, for example, *VISUAL EXPERIMENT ON LED LIGHTING QUALITY WITH COLOR QUALITY SCALE COLORED SAMPLES*, Nicolas Pousset, CIE 2010 *Lighting Quality and Energy Efficiency,* 14-17 Mar. 2010, which is incorporated herein by reference.

Gamut Area Index (GAI) refers to the subset of colors which can be accurately represented in a given circumstance, such as within a given color space or by a certain output device. GAI is further described in, for example, Color Rendering: A Tale of Two Metrics by Mark S. Rea et al., 2008 Wiley Periodicals, Inc. Col Res Appl, 33, 192-202, 2008; Published online in Wiley InterScience (www.interscience.wiley.com). DOI 10.1002/col.20399, which is incorporated herein by reference.

The ratio of scotopic luminance (or lumens) versus photopic luminance in a light source (S/P ratio) is a multiplier that can be used to determine the apparent visual brightness of a light source as well as how much light, that is useful to the human eye, a source emits. The luminous efficacy of a source is a measure of the efficiency with which the source provides visible light from electricity. Luminous efficacy is a measure of the proportion of the energy supplied to a lamp that is converted into light energy. It can be calculated by dividing the lamp's luminous flux, measured in lumens, by the power consumption, measured in watts.

As appreciated by the present inventors, an LED fixture can be configured as separately switched LED segments, each of which can have a respective spectral power distribution. Further, particular LED segments can be populated with LEDs of a particular spectral power distribution that is the target value for dimming. In operation, an LED segment selection circuit can selectively control the current through the particular LED segments so that the overall spectral power distribution of light generated by the apparatus shifts toward a targeted spectral power distribution as dimming proceeds. For example, a full spectral power distribution may be provided by the switching circuit to switch current through a combination of all of the LED segments.

It will be further understood, that in some embodiments according to the invention, the term "LED segment" can include any configuration of LEDs that allow for the LED segments to be separately controlled. For example, in some embodiments according to the invention, an LED segment can be a string of LEDs that can be controlled (such as by dimming) separately from one or more of the other LED segments included in the LED fixture. Accordingly, in such embodiments according to the invention, the LED segments can be arranged as separately controllable banks of LEDs, where each bank can be configured to have a particular spectral power distribution. It will be further understood that the LEDs within each of the "banks" can be configured in any way (including serial and parallel arrangements) which allows the respective bank to be controlled separately from the other banks.

For example, in some such embodiments including "banks" as the LED segments, a first bank can be populated with LEDs of a particular spectral power distribution that is the target value for dimming, such as a particular CCT value. Furthermore, the other banks of LEDs can include LEDs having respective different particular spectral power distributions. In operation, an LED segment selection circuit can selectively control the current through the LED segments so that the overall spectral power distribution of light generated by the apparatus shifts toward a targeted spectral power distribution as dimming proceeds. For example, a full spectral power distribution may be provided by the switching circuit to switch current through a combination of all of the LED segments.

In still other embodiments according to the invention, the LED segments can be configured in a serial string arrangement, where each LED segment may be controlled using, for example, the phase or level of a voltage signal that is used to drive the LED segment as a string. Accordingly, in such embodiments according to the invention, the LED segments can be arranged as separately controllable portions the LED string, where each LED segment of the string can be configured to have a particular spectral power distribution. For example, the LED segment having the lowest forward voltage of all of the LED segments can be populated with LEDs of a particular spectral power distribution that is the target value for dimming. In operation, an LED segment selection circuit can selectively switch the string current through the LED segments so that the overall spectral power distribution of light generated by the apparatus shifts toward a targeted spectral power distribution as dimming proceeds. For example, a full spectral power distribution may be provided by the switching circuit to switch current through a combination of all of the LED segments.

As dimming proceeds, however, the spectral power distribution of the light emitted by the apparatus can shift from the full spectral power distribution to a targeted spectral power distribution. Conversely, as dimming is reduced, the spectral power distribution of light output from the apparatus can shift from the targeted spectral power distribution back to the full spectral power distribution. In some embodiments according to the invention, the targeted spectral power distribution can be provided by the spectral power distribution of a particular LED segment (which may be provided by either a singular LED or a combination of LEDs in the particular segment), whereas the full spectral power distribution can be provided by the combination of the spectral power distribution all of the LED segments, and the time during which each is on. Accordingly, the targeted spectral power distribution can shift the generated light to appear more vivid, warmer, or to have a particular color (e.g., greenish) as the light is dimmed.

The targeted spectral power distribution, as well as the full spectral power distribution, can be provided by the combination of the light characteristics described herein associated with the LED segments provided. For example, in some embodiments according to the invention, different LED segments can have different values of ones of the lighting characteristics, such as CRI, such that when the apparatus is dimmed, the increasing portion of power provided to the targeted LED segment increases so that the targeted LED segment has a greater influence on the spectral power distribution of the apparatus due to the particular spectral power distribution of the targeted LED segment to which the increasing portion of power is delivered during dimming.

Furthermore, the shift in the spectral power distribution may, in some embodiments according to the invention, be irrespective of other lighting characteristics associated with the LED segments. For example, in the example described above, even though the different LED segments may have different CRI values, those LED segments may have identical CCT values. Accordingly, during dimming the apparatus may shift towards the targeted spectral power distribution associated with the targeted LED segment despite the fact that the CCT values for the segments are the same. Accordingly, spectral power distributions of the respective LED segments may be different based on at least one lighting characteristic of those LED segments being different from one another.

As further appreciated by the present inventors, an LED fixture can be configured as separately switched LED segments, each of which can have a respective CCT value. Further, the LED segment providing the targeted value can be populated with LEDs of a particular CCT value that is the target value for dimming. In operation, an LED segment selection circuit can selectively control the current through the LED segments so that the overall CCT value of light generated by the apparatus shifts toward a CCT target value as dimming proceeds. For example, at full brightness, a full CCT value may be provided by the fixture through a particular combination of all of the LED segments being on. As dimming proceeds, however, the CCT value of the light emitted by the apparatus can shift from the full CCT value to a targeted CCT value. Conversely, as dimming is reduced, the CCT light output from the apparatus can shift from the targeted CCT value back to the full CCT value. In some embodiments according to the invention, the targeted CCT value can be provided by the CCT value of a particular LED segment (which may be provided by either a singular LED or a combination of LEDs in the particular segment), whereas the full CCT value can be provided by a combination of the CCT values all of the LED segments, and the timing during which the segments are on.

As further appreciated by the present inventors, an LED string can be configured as separately switched LED segments, each of which can have a respective CCT value. Further, the LED segment having the lowest forward voltage of all of the LED segments can be populated with LEDs of a particular minimum CCT value that is the target value for dimming. For example, in some embodiments according to the invention, an LED string can include three separately switched segments: a high-voltage segment, a mid-voltage segment, and a low voltage segment, where the low voltage segment includes LEDs with a CCT value of the intended minimum CCT value to be provided as the target for dimming.

When dimming (such as phase cut dimming) is applied to such a these configuration, an increasing portion of the power over a cycle can be delivered to the low voltage segment including the minimum value CCT LEDs as dimming proceeds. Therefore, in some embodiments according to the invention, as the solid-state lighting apparatus is dimmed the emitted light may more closely approximate incandescent lighting when, for example, the minimum value CCT LEDs are "warm" in color such as that provided by LEDs having a CCT value of about 1800K or ccxy (0.55, 0.41).

In some embodiments of the invention, the LED segments in the string can be arranged according to the respective CCT values for the LED segments. In some embodiments according to the invention, the LED segments in the string can also be arranged according to their respective forward bias voltage. For example, in some embodiments according to the invention, the highest value CCT LEDs are included in the high-voltage segment, the minimum value CCT LEDs are included in the low-voltage segment, and the midrange value CCT LEDs are included in the mid-voltage segment.

In some embodiments according to the invention, the selective switching of the string current through the targeted LED segment, can be provided using magnitude interval bits that indicate the present magnitude of the rectified AC voltage signal. For example, in some embodiments according to the invention, an analog to digital conversion can be carried out on the rectified AC voltage signal to provide digital values indicative of the magnitude. The digital values can be used to control the states of switches used to selectively bypass the string current around the respective LED segment. As a cycle of the rectified AC voltage signal proceeds, the digital values provide an indication of the magnitude which is then used to select which LED segments should receive the string current and which should not. During dimming, the targeted LED segment can be selectively switched using a low order digital values representing the magnitude. Accordingly, as dimming proceeds, and increased portion of the power from the rectified AC voltage can be provided to the targeted LED segment, which generate light having the targeted spectral power distribution or targeted CCT value as described during.

Figure 3:
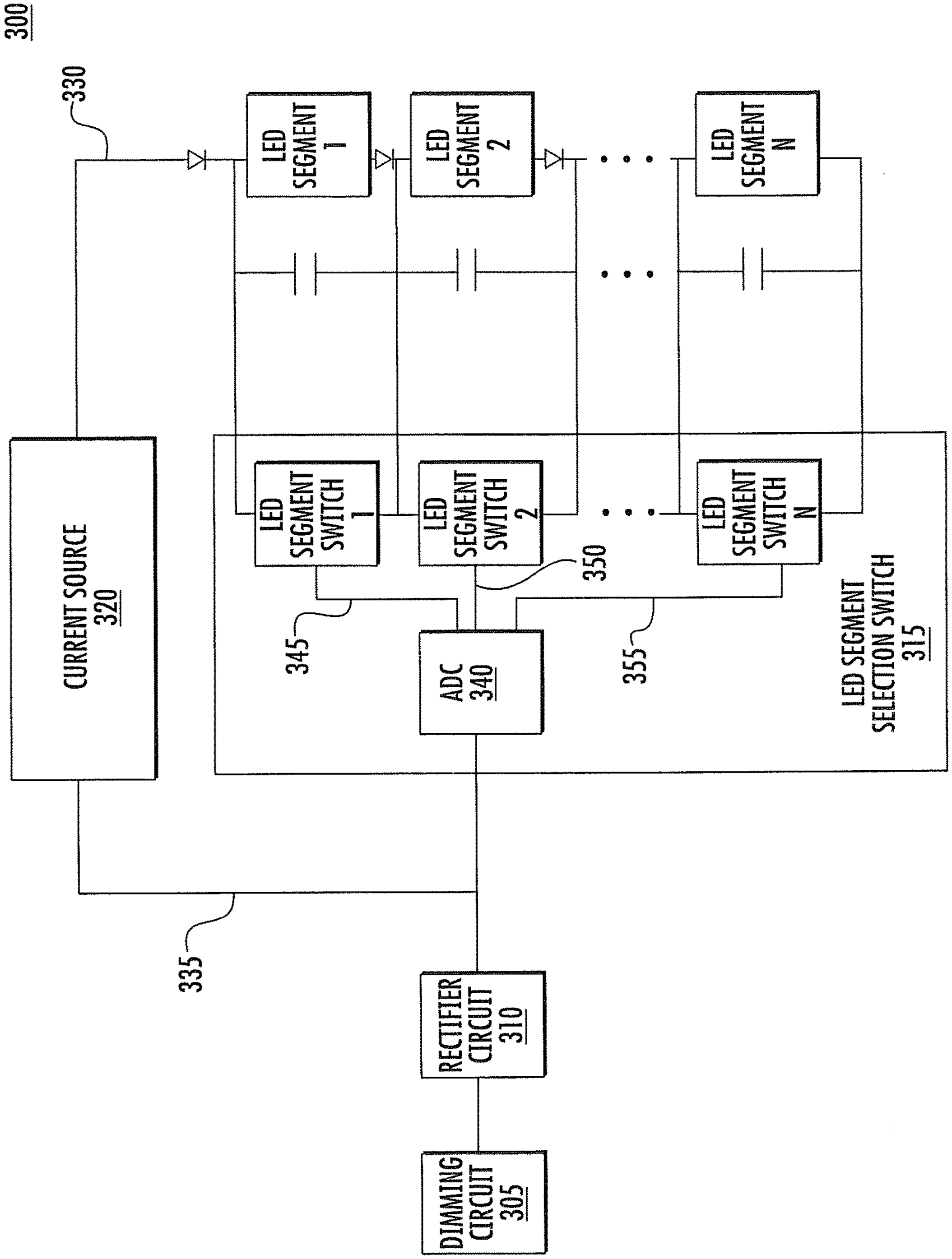
FIG. 3 is a block diagram illustrating a solid-state lighting apparatus in some embodiments according to the invention.

FIG. 3 is a block diagram illustrating a solid-state lighting apparatus in some embodiments according to the invention. According to FIG. 3, an ac voltage signal is provided to a rectifier circuit 310 by a dimmer circuit 305. It will be understood that the dimmer circuit 305 can provide the ac voltage signal in accordance with what is referred to as "phase cut dimming" where, for example, the level of the ac voltage signal remains clamped to zero up until a specified phase of the cycle. Beyond the specified phase, the ac voltage signal is not clamped to zero. For example, in some embodiments according to the invention, the dimmer circuit 305 may be configured to dim the light provided by the apparatus 300 by clamping the ac voltage signal to zero up until 90 degrees of phase within the ac voltage signal cycle, where after the rectified ac voltage signal is not clamped for the remainder of the phase.

It will be understood that the dimmer circuit 305 can be a leading edge phased cut dimmer circuit, a trailing edge phase cut dimmer circuit, or the like. In some embodiments according to the invention, the dimmer circuit 305 can be a rheostat circuit to reduce the magnitude of the ac input signal in response to dimming. In some embodiments according to the invention, the dimming can also be provide dimming control using a digital interface, such as those described on the Internet at http://www.lutron.com/TechnicalDocumentLibrary/Diva_0-10Vsubmittal.pdf, the entirety of which is hereby incorporated by reference.

The rectifier circuit 310 provides a rectified ac voltage signal 335 to a current source 320 to generate an LED string current 330. It will be understood that the current source 320 can be a voltage controlled current source that is configured to regulate the string current 330 in response to the rectified ac voltage signal 335. In some embodiments according to the invention, the rectified ac voltage signal 135 can have a frequency of about 120 Hz where, for example, the ac voltage signal provided to the rectifier circuit 310 has a frequency of about 60 Hz. It will be understood, however, that embodiments according to the invention can utilize ac voltage signals having any useable frequency.

The current source 320 is coupled to an LED string 325 that includes a plurality of separately switchable LED segments 1-N, electrically coupled in the series with one another. In some embodiments according at the invention, each of the separately switchable LED segments is configured to emit light having a particular CCT value. In some embodiments according to the invention, the LED segments can be arranged in the string 325 to include at least one targeted LED segment N which is configured to shift the characteristic of the light generated by the apparatus from any full targeted spectral power distribution to, for example, a targeted spectral power distribution, as dimming proceeds. In some embodiments according to the present invention, the targeted spectral power distribution can be provided using LEDs in the targeted segment that have particular CRI values, CCT values, efficacy values, S/P ratios or any other lighting characteristic that is intended to be specified as a target light for dimming.

In some embodiments according to the invention, the LED segments can be arranged in the string 325 to include at least one LED segment having a targeted CCT value targeted for dimming. For example, in some embodiments according to the invention, LED segment N is characterized as having a particular CCT value which is different from the other LED segments. Accordingly, as dimming proceeds, the light output from the apparatus 300 and shift in full CCT value provided by the combination of all LED segments toward a targeted CCT value represented by LED segment N.

In some embodiments according to the invention, the LED segments can be arranged in the string 325 in descending order according to the respective CCT values of the segments. For example, in some embodiments according to the invention, LED segment N is characterized as having the lowest CCT value of all of the segments, whereas LED segment is 1 characterized as having the highest CCT value of all of the segments. Still further, LED segment 2 is characterized as having a CCT value that is greater than that of segment N but less than that of segment 1.

Furthermore, the LED string 325 can be configured so that the LED segments are also arranged in descending order according to the respective forward bias voltages of the segments. For example, LED segment 1 can be configured with LEDs so that the forward bias voltage is about equal to 80 volts, whereas LED segment 2 can be configured with LEDs so that the forward bias voltage thereof it is about equal to 40 volts, and segment N can be configured with LEDs so that the forward bias voltage thereof is about equal to 20 Volts.

The rectified AC voltage signal 335 can also be provided to an LED segment selection circuit 315, which can be configured to selectively switch current to particular ones of the LED segments based on the magnitude of the rectified ac voltage signal. In particular, the rectified AC voltage signal can be provided to an analog to digital converter (ADC) 340 which can generate magnitude interval bits used to provide control signals 345, 350, and 355 to respective LED segment switches 1, 2, and N. It will be understood that the ADC 340 can be included in the LED segment selection circuit 315 or separately. It will be further understood that the indication of the magnitude interval can be provided using other techniques.

As further shown in FIG. 3, the LED segment switches 1-N are coupled across respective ones of the LED segments 1-N. In operation, the control signals 345, 350, and 355 switch according to the magnitude interval timing to open/close the respective LED segment switch 1-N. When the particular control signal opens the respective LED segment switch, the string current 330 passes through the LED segment, where as when the control signal closes the respective LED segment switch, the string current bypasses the LED segment. Accordingly, the control signals 345, 350, and 355 can be used to separately switch the string current 330 through/around each of the LED segments as the magnitude changes.

As further shown in FIG. 3, capacitors can be provided across each of the LED segments to address issues, such as, flicker. For example, when a particular LED segment switch opens, the string current 330 passes through the respective LED segment and charges the respective capacitor. In contrast, when the particular LED segments switch closes, the string current 330 passes through the LED segment switch to bypass the LED segment, but the capacitor can provide current to the LED segment that is bypassed by the string current 330, to remain illuminated. Still further, FIG. 3 also illustrates that blocking diodes can be included to prevent the capacitors from discharging (through the LED segment switch) when the LED segment switch closed.

Figure 4:
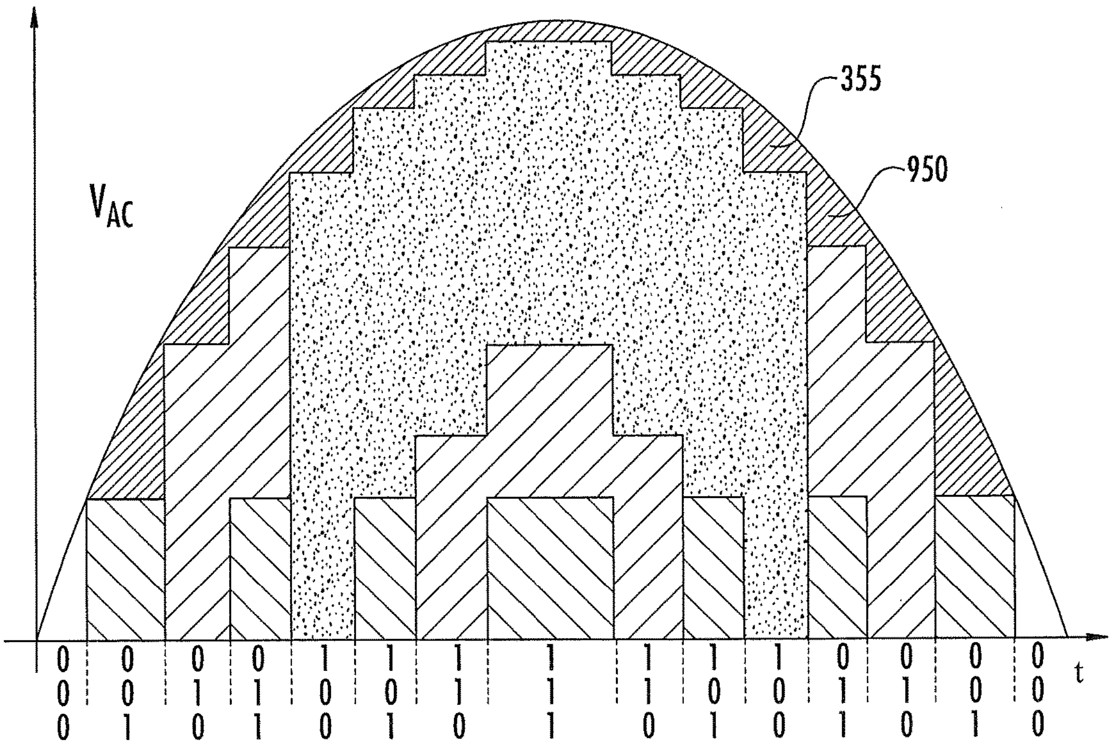
FIG. 4 is a graphical and table representation of selective switching of LED segments of the apparatus shown in FIG. 3 in some embodiments according to the invention.

FIG. 4 is a graphical and table representation of selective switching of LED segments of the apparatus shown in FIG. 3 along with the magnitude of the rectified AC voltage signal in some embodiments according to the invention. According to FIG. 4, a portion of the rectified AC voltage signal 335 is annotated with indications of the magnitude interval bits across the horizontal axis. As shown, the magnitude interval bits transition from a first state (000) up to a last state (111) and then transition down again to the first state (000). Moreover, transitioning of many magnitude interval bits corresponds to the increase and decrease in the magnitude of the rectified AC voltage signal. Accordingly, the magnitude interval bits can be used as an indication of the magnitude of the rectified AC voltage signal so that the string current 332 can be selectively switched to the appropriate combination of LED segments during the different intervals of the rectified AC voltage signal cycle.

For example, assuming that the LED string 325 includes three LED segments having forward bias voltages of 80 V, 40 V, and 20 V, respectively, when the magnitude of the rectified AC voltage signal is about 20 V, the magnitude interval bits are (001) which can be used to switch the string current 330 through LED segment 3 but to bypass the remaining LED segments. When the magnitude of the rectified AC voltage signal reaches about 40 V, the magnitude interval bits are (010), which switches the string current through LED segment 2 but bypasses LED segments 1 and 3.

When the magnitude of the rectified AC voltage signal reaches about 60 volts, the magnitude interval bits are (011), which switches the string current 320 through LED segments 2 and 3 but bypasses LED segment 1. When the magnitude of the rectified AC voltage signal reaches about 80 V, the magnitude interval bits are (100), which switches the string current 320 through LED segment 1, but bypasses LED segments 2 and 3. When the magnitude of the rectified AC voltage signal reaches about 100 V, the magnitude interval bits are (101), which switches the string current 320 through LED segments 1 and 3, but bypasses LED segment 2.

When the magnitude of the rectified voltage signal reaches about 120 V, the magnitude interval bits are (110), which switches the string current 320 through LED segments 2 and 3, but bypasses LED segment 1. When the magnitude of the rectified voltage signal reaches about 140 V, the magnitude interval bits are (111), which switches the string current 320 through LED segments 1, 2, and 3. Operations continue, but in reverse order until the magnitude interval bits are (000) thereby completing the cycle of the rectified AC voltage signal.

Figure 9:
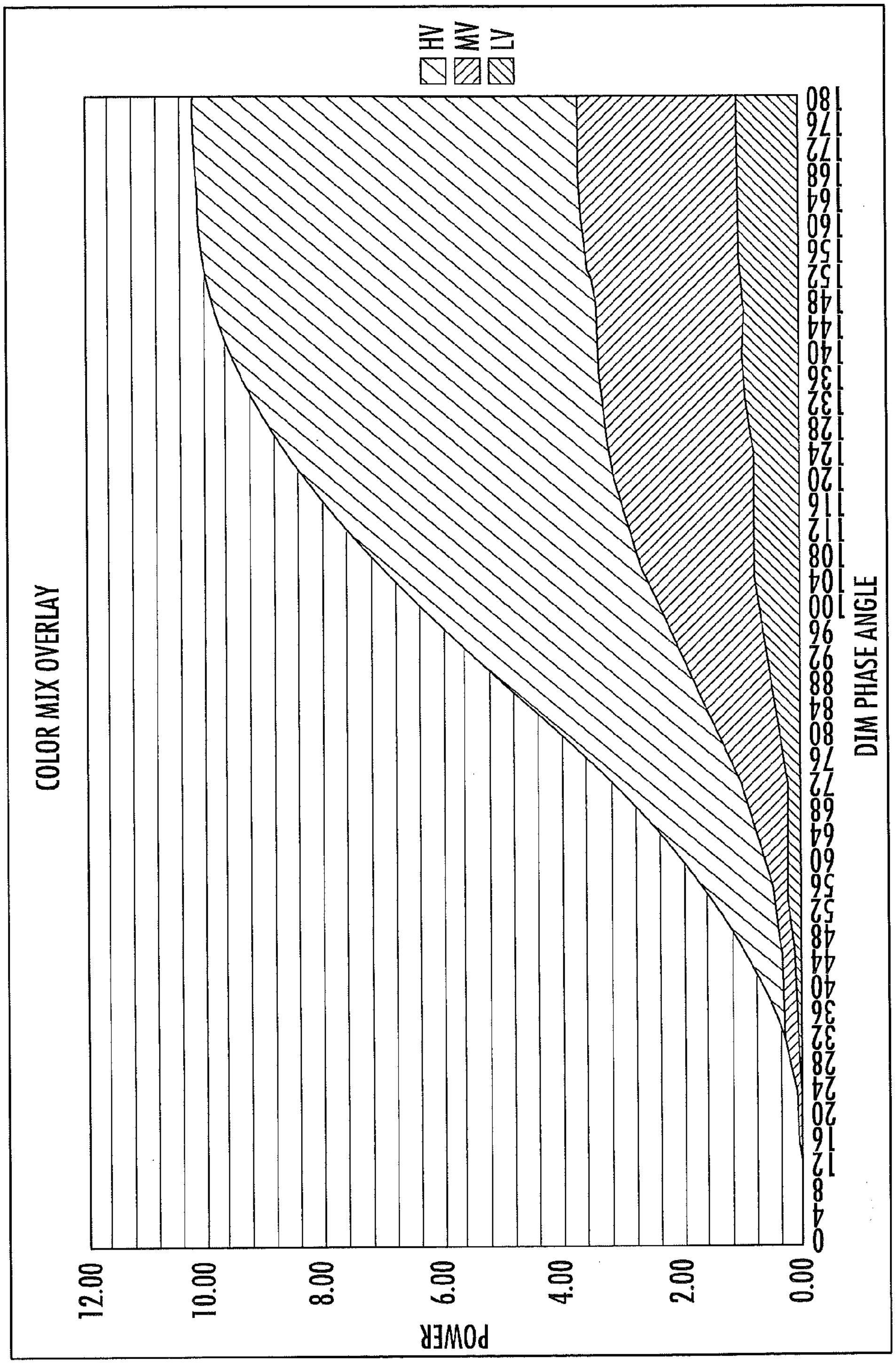
FIG. 9 is a graphical representation of instantaneous power in LED segments as a function of dimming phase angle in some embodiments according to the invention.

When the circuit of FIG. 3 is subject to dimming and operates according to FIG. 4, an increasing portion of the power provided over the cycle is delivered to the targeted LED segment including the LEDs having the targeted spectral power distribution configured by the particular lighting characteristics as described herein. As shown in FIG. 9, as the dimming phase angle decreases toward the low end of the range, an increasing portion of the power from the rectified AC voltage is provided to the low-voltage segment, which may be the targeted LED segment that provides the targeted spectral power distribution to which the light output shifts during dimming.

For example, in some embodiments according to the invention, the LED segments in the string can be configured such that non-targeted LED segments include relatively low CRI LEDs but with relatively high efficacy, whereas the targeted LED segment can include higher CRI LEDs but with relatively low efficacy. In response to dimming, the targeting spectral power distribution can be provided by the shift from relatively high lumen per watt output light with high efficacy to light that is relatively low efficacy but has higher CRI. Moreover, the shift toward the targeted spectral power distribution can be provided despite the fact that other lighting characteristics between the LED segments may be the same. For example, in some embodiments according to the invention, a targeted LED segment can include LEDs that are configured to generate light having a CRI of about 95 at low efficacy, whereas other LED segments can generate light having higher efficacy but at a CRI of about 75.

A particular light having a full spectral power distribution can be generated by the combination of all of the LED segments when the light is full on, for example. When the light is dimmed, however, an increasing portion of the power from the rectified ac voltage to the LED string is increasingly provided to the targeted LED segment so that the light generated shifts from the full spectral power distribution toward a targeted spectral power distribution that is predefined by the LEDs included in the targeted LED segment. Accordingly, the targeted spectral power distribution can have different lighting characteristics than the full spectral power distribution provided by the combination of all LED segments.

For example, in some embodiments according to the invention, where the targeted LED segment includes a minimum value CCT, as the solid-state lighting apparatus is dimmed the emitted light may more closely approximate incandescent lighting when, for example, the minimum value CCT LEDs are "warm" in color. For example, when phase cut dimming is applied at about 45° of phase (using leading edge or trailing edge dimming) to the circuit of FIG. 3, warm colored dimming may be more efficiently provided (i.e. without the use of additional components specifically intended for the provisioning of warm light dimming) as the segment with the minimum value CCT LEDs is more heavily utilized whereas the higher voltage LED segments are utilized less (due to the dimming).

It will be understood that the control of the separately switchable LED segments can be provided according to any method by which the timing or magnitude of the rectified ac voltage signal may be determined. For example, in some embodiments according to the invention, the switching may be provided using the techniques described in commonly assigned U.S. Pat. No. 8,476,836, the disclosure of which is incorporated herein by reference.

Figure 5:
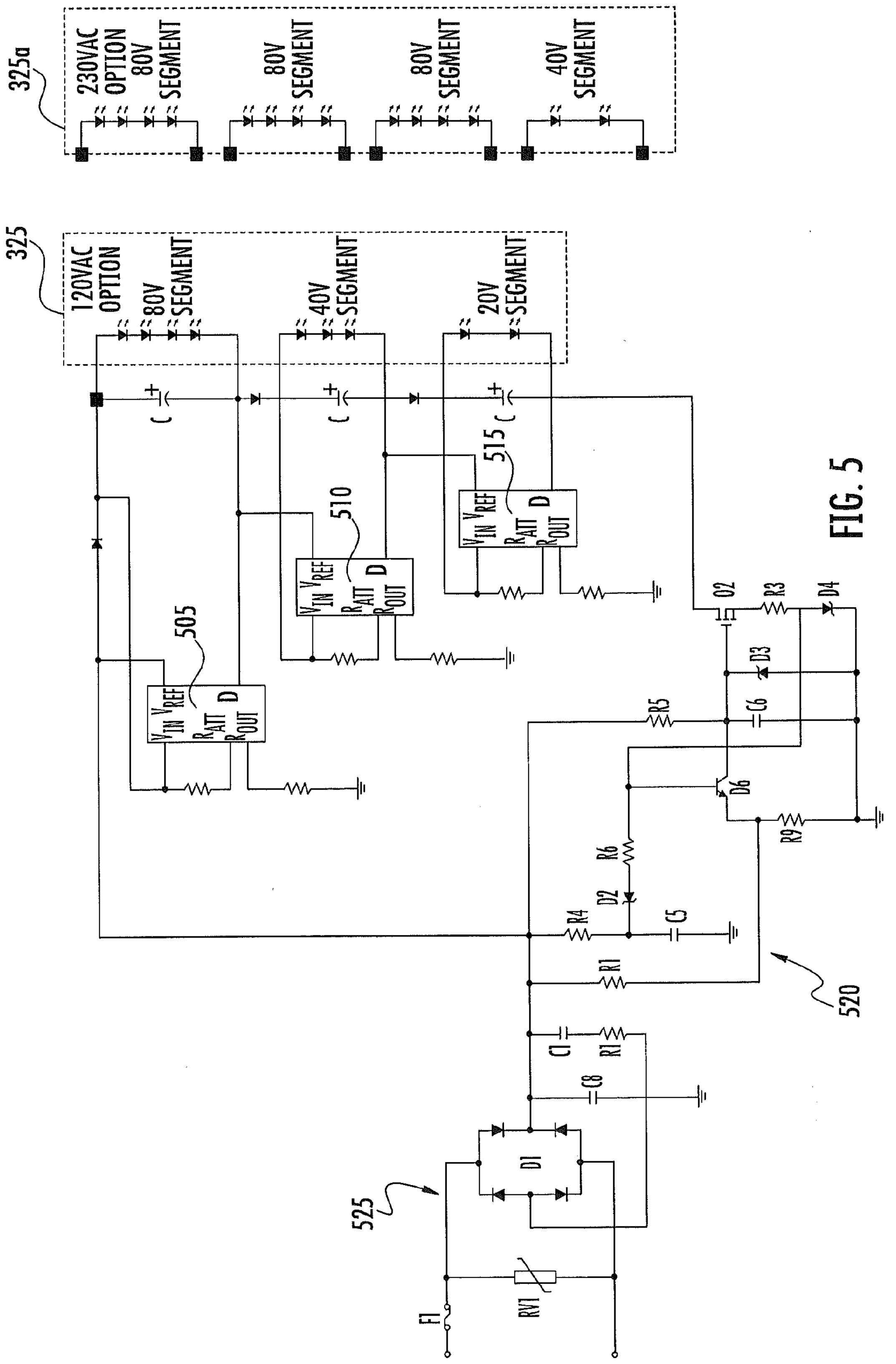
FIG. 5 is a schematic diagram illustrating a solid-state lighting circuit in some embodiments according to the invention.

FIG. 5 is a schematic diagram illustrating a solid-state lighting apparatus in some embodiments according to the invention. In particular, the circuit shown in FIG. 5 includes a rectification circuit 525 that provides the rectified AC voltage signal 335, and a more detailed illustration of an exemplary voltage controlled current source 520 that can regulate the string current 330 in response to the magnitude of the rectified AC voltage signal 335 applied to the LED string 325. In operation, the solid-state lighting apparatus shown in FIG. 5 operates to selectively switch the string current through different ones of the LED segments responsive to the magnitude of the rectified AC voltage such that the LED segments switch on/off sequentially in response to the variation in the rectified AC voltage.

According to FIG. 5, the functionality of the LED segment selection circuit 315 shown in FIG. 3 is provided by separate switching circuits 505-515, coupled across a respective one of the LED segments shown in the string 325. In operation, the switching circuits 505-515 provide the same functions described above with reference to FIGS. 3 and 4 so that the appropriate LED segment is switched in/out of the string given the present magnitude of the rectified AC voltage signal. It will be understood at the switching circuits 505-515 maybe separately configured to indicate their respective connection (and voltage) to the particular LED segment in the string 325. For example, the resistors shown connected to each of the switching circuits can be selected to indicate the position of the switching circuit in the LED string 325, and the forward biasing needed for the particular LED segment across which the switch is coupled.

It will be understood that the switching circuits 505-515 can be provided by any circuit that allows the control described herein. For example, in some embodiments according to the invention, the switching circuits 505-515 can be provided by a 100 V MOSFET switch which operates as described. In such embodiments, the 100 V MOSFET switch can operate in an input voltage range of about 7.5 V to about 100 V, and may provide control of rise and fall times to provide low EMI.

Still further, the circuit illustrated in FIG. 5 provides alternative configurations for the LED string. In particular, the LED string 325 includes three separately switchable LED segments configured for inclusion in the lighting apparatus operating from a 120 V AC power source. The uppermost LED segment provides a high voltage (80V) LED segment configured to have an associated CCT value of about 3100K. The middle LED segment provides a mid-voltage (40 V) LED segment configured to have an associated CCT value of about 2400K to about 2100K. The lowermost segment provides a low voltage (20 V) LED segment configured to have an associated CCT value of about 1800 K (i.e., the lowest CCT value among all of the LED segments in the string).

It will be understood that the LEDs included in each of the LED segments can be selected to provide a particular spectral power distribution for the respective segment in which those LEDs are included. In some embodiments according to the invention, LEDs included in the respective LED segment are configured to have a spectral power distribution that is equal to the target spectral power distribution for that segment. For example, a spectral power distribution of the targeted LED segment can be defined by a combination of the lighting characteristics described herein, such as CRI, CCT, etc.

The LED string 325*a*, includes four separately switchable LED segments configured for inclusion in a lighting apparatus operating from 230 V AC power source. The upper LED segment provides a first high voltage (80V) LED segment configured to have an associated CCT value of about 3100K. In some embodiments according to the invention, The lower LED segment provides a low voltage (40 V) LED segment configured to have an associated CCT value of about 1800 K (i.e., the lowest CCT value among all of the CCT values for the LED segments in the string).

It will be understood that the LEDs included in each of the LED segments can be selected to provide a CCT value for the respective segment in which those LEDs are included. In some embodiments according to the invention, LEDs included in the respective LED segment are configured to have a CCT value that is equal to the target CCT value for that segment. For example, if the target CCT value for the lowest LED segment in FIG. 5 is 1800 K., the LEDs included in that LED segment can each have a CCT value of 1800 K.

Figure 10:
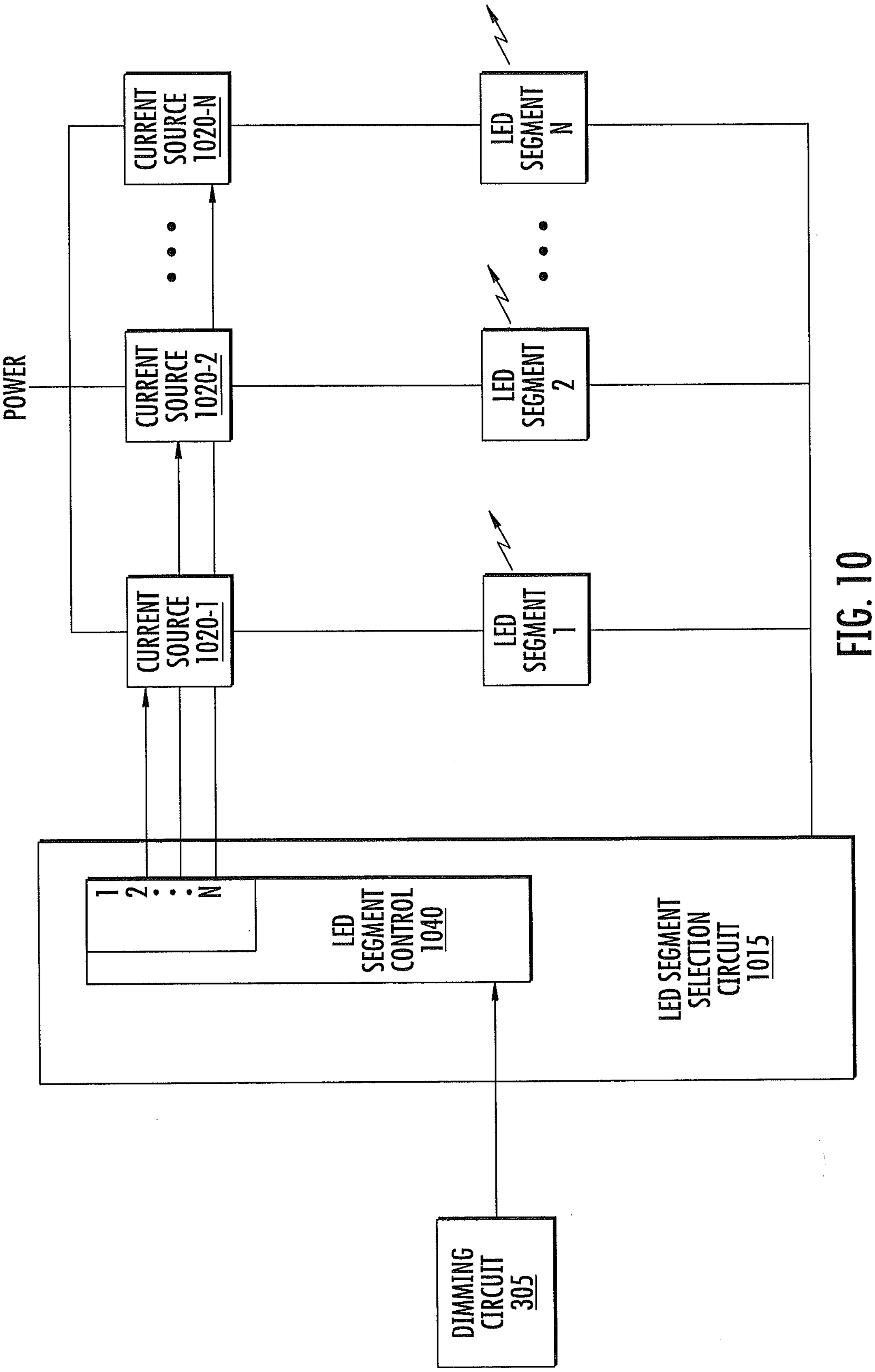
FIG. 10 is a block diagram illustrating a solid-state lighting apparatus in some embodiments according to the invention.

FIG. 10 is a block diagram illustrating a solid-state lighting apparatus in some embodiments according to the invention. According to FIG. 10, LED segments 1-N are provided in separately controllable respective LED segments arranged in banks. The LED segments 1-N can be separately controlled by an LED segment selection circuit 1015 using a LED segment control circuit 1040. In some embodiments according to the invention, the LED segment control circuit 1040 can separately operate respective current sources 1020-1-N for each of the LED segments responsive to input from the dimming circuit 305 to the LED segment selection circuit 1015. For example, the current source 1020-1 can be used to control the current to LED segment 1, the current source 1020-2 can be used to control the current to LED segment 2, and the current source 1020-N can be used to control the current to LED segment N. As further shown in FIG. 10, the current sources 1020-1-N can draw current from a power source, such as a DC power source. Other power sources may also be used.

Each of the current sources 1020-1-N can be set responsive to the input from the dimming circuit 305. It will be understood that the dimming circuit 305 can be any circuit configured to communicate a level of dimming desired by a user or system. In some embodiments according to the invention, the dimming circuit 305 can also provide dimming control using a digital interface, such as those described on the Internet at http://www.lutron.com/TechnicalDocumentLibrary/Diva_0-10Vsubmittal.pdf, the entirety of which is hereby incorporated by reference.

In some embodiments according at the invention, each of the separately controlled LED segments 1-N is configured to emit light having a particular CCT value. In some embodiments according to the invention, the LED segments 1-N can be arranged to include at least one targeted LED segment N which is configured to shift the characteristic of the light generated by the apparatus from any full targeted spectral power distribution to, for example, a targeted spectral power distribution, as dimming proceeds. In some embodiments according to the present invention, the targeted spectral power distribution can be provided using LEDs in the targeted segment that have particular CRI values, CCT values, efficacy values, S/P ratios or any other lighting characteristic that is intended to be specified as a target light for dimming.

In some embodiments according to the invention, the LED segments 1-N can be arranged to include at least one LED segment having a targeted CCT value targeted for dimming. For example, in some embodiments according to the invention, LED segment N is characterized as having a particular CCT value which is different from the other LED segments. Accordingly, as dimming proceeds, the light output from the apparatus can shift from a full CCT value provided by the combination of all LED segments toward a targeted CCT value represented by LED segment N.

Figure 11:
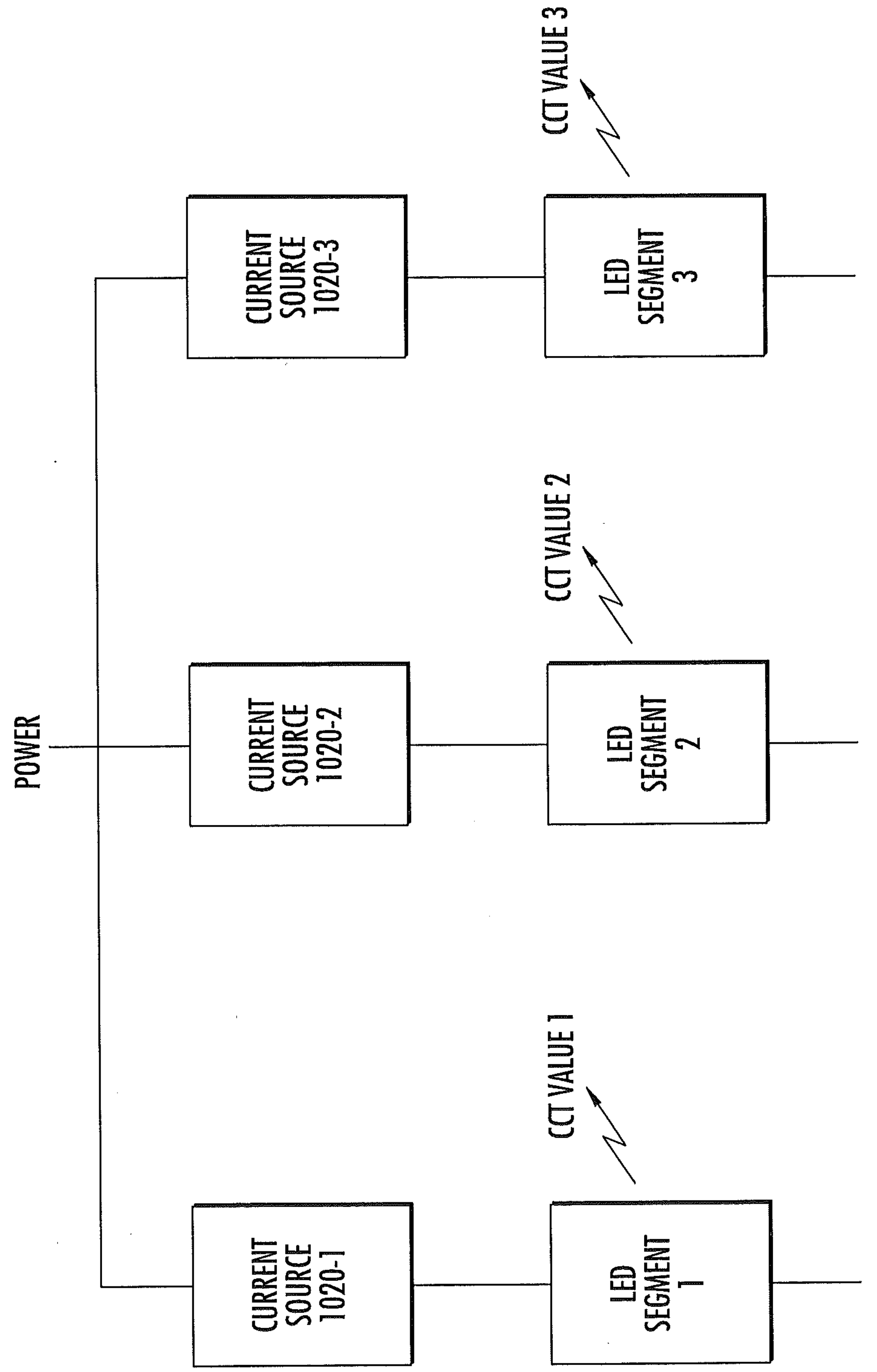
FIG. 11 is a block diagram illustrating a configuration of a solid-state lighting apparatus including particular CCT values in each of the LED segments in some embodiments according to the invention.

FIG. 11 is a block diagram illustrating a configuration of a solid-state lighting apparatus including particular CCT values in each of the LED segments in some embodiments according to the invention. According to FIG. 11, each of the LED segments 1-3 is characterized by a respective predetermined CCT value 1-CCT value 3, where LED segment 3 is the targeted segment for dimming. In some embodiments according to the invention, each of the CCT values corresponding to the particular LED segments can be located on Planckian locus in FIG. 1. Furthermore, it will be understood that the CCT values used herein include values that are within about seven Macadam ellipses of Planckian locus in FIG. 1. In some embodiments according to the invention, it will be understood that the CCT values used herein include values that are within about four Macadam ellipses of the Planckian locus in FIG. 1. Although three LED segments are shown in FIG. 11, it will be understood that any number of LED segments can be utilized in some embodiments according to the invention.

According to FIG. 11, in some embodiments according to the invention, LED segment 1 can be populated with LEDs such that the CCT value 1 for light emitted by the segment is equal to about 10000K to about 7,000K, LED segment 2 can be populated with LEDs such that the CCT value 2 for light emitted by the segment is equal to about 7000K to about 5000K, and LED segment 3 can be populated with LEDs such that the CCT value 3 for light emitted by the segment is equal to about 5000K to about 3000K. In some embodiments according to the invention, LED segment 1 can be populated with LEDs such that the CCT value 1 for light emitted by the segment is equal to about 7000K to about 5000K, LED segment 2 can be populated with LEDs such that the CCT value 2 for light emitted by the segment is equal to about 5000K to about 3000K, and LED segment 3 can be populated with LEDs such that the CCT value 3 for light emitted by the segment is equal to about 3000K to about 1000K.

In some embodiments according to the invention, as dimming proceeds, the LED segment selection circuit 1015 can separately control the LED segments 1-3 using current sources so that an increasing portion of the power is provided to the targeted LED segment (i.e. LED segment 3). It will be further understood, however, that in some embodiments according to the invention, any of the LED segments can be the targeted LED segment. For example, in some embodiments according to the invention, LED segment 1 or 2 can be LED segment that is targeted during dimming.

Figure 6:
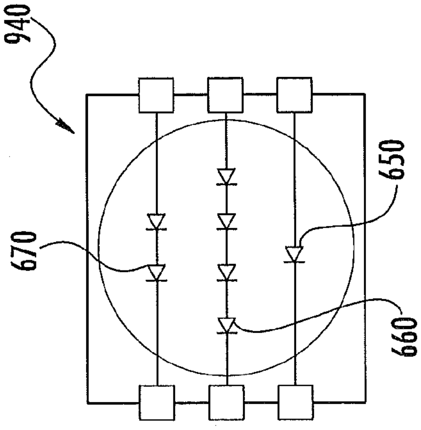
FIG. 6 is a schematic representation of an LED package including the LED segments illustrated in FIG. 5 in some embodiments according to the invention.

FIG. 6 is a schematic representation of an LED package including the LED segments illustrated in FIG. 5 in some embodiments according to the invention. According to FIG. 6, a single LED package 940 is configured to include three segments which correspond to a segments described above in reference to, for example, FIGS. 3-5. The single LED package 940 can include a low-voltage LED segment 650 rated at about 22 V provided by coupling fourteen epi junctions in series with one another (where each at the junctions has a forward bias voltage of about 1.5 V). The single LED package 940 also includes a mid-voltage LED segment 670 rated at about 44 V provided by coupling two sets of fourteen epi-junctions in series with one another (where each at the junctions has a forward bias voltage of about 1.5 V). The single LED package 940 also includes a high-voltage LED segment 660 rated at about 88 V provided by coupling four sets of fourteen epi-junctions in series with one another (where each at the junctions has a forward bias voltage of about 1.5 V). The single LED package 940 also includes electrical i/o terminals for each of the LED segments.

Figure 7:
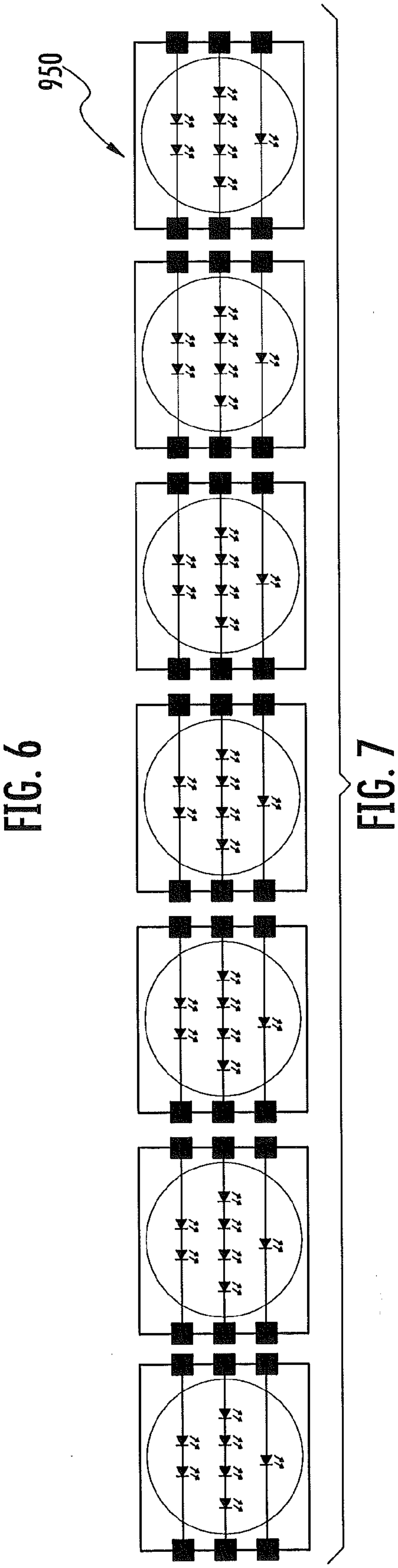
FIG. 7 is schematic representation of a plurality of the LED packages shown in FIG. 6 coupled together in a solid-state lighting apparatus in some embodiments according to the invention.

FIG. 7 is schematic representation of a plurality of the LED packages shown in FIG. 6 coupled in series together in a solid-state lighting apparatus in some embodiments according to the invention. In particular, each of the low-voltage segments 650 in the respective single LED packages 940 can be coupled together in series in the arrangement shown in FIG. 7. Similarly, each of the mid-voltage segments 670 and high-voltage segments 660 can be coupled together in series.

Figure 8A:
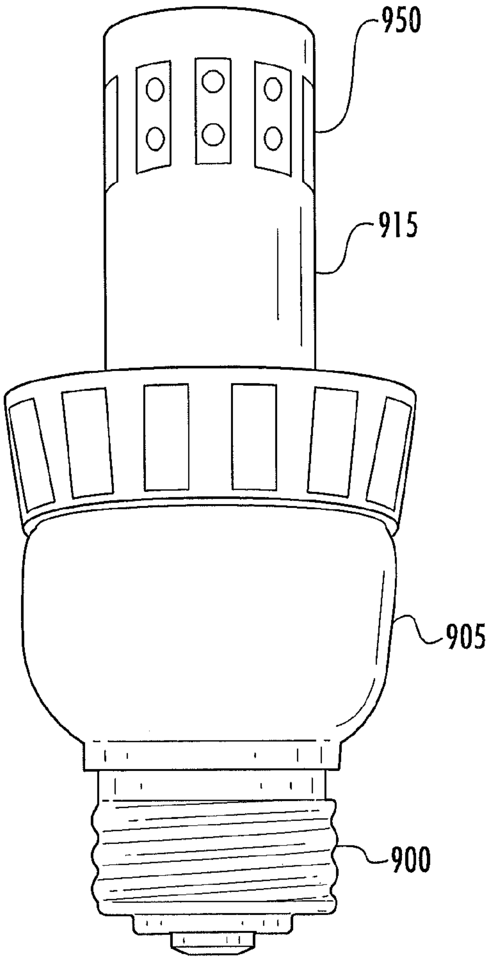
FIGS. 8A and 8B are a perspective and a cross-sectional view of a solid-state lighting apparatus including the LED packages illustrated in FIG. 7 in some embodiments according to the invention.
Figure 8B:
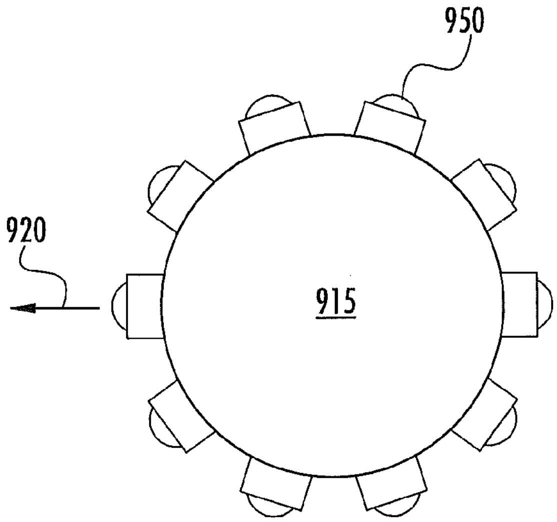

FIGS. 8A and 8B are a perspective and a cross-sectional view of a solid-state lighting apparatus including the LED packages illustrated in FIG. 7 in some embodiments according to the invention. According to FIG. 8, a housing 905 is coupled to an electrical connector 900 that is configured to releasably coupled to a standardized electrical fixture, which may be, for example, an Edison style or any other type of standardized electrical fixture.

A post 915 protrudes from the housing 905 and includes an outer surface that faces radially outward in a direction 920. The plurality of the LED packages 950 is electrically coupled in series with one another, and is spaced apart on the outer surface around a circumference thereof. The illustrated arrangement may provide for improved incandescent style dimming by arranging the LED packages according to the present invention around the circumference if, for example, one or more one of the LED packages (entirely or partially) fails.

As described herein, an LED string can be configured as separately switched LED segments, each of which can have a different CCT value. Further, the LED segment having the lowest forward voltage of all of the LED segments can be populated with LEDs of a particular CCT value that is the target value for dimming. For example, in some embodiments according to the invention, an LED string can include three separately switched segments: high-voltage segment, a mid-voltage segment, and a low voltage segment, where the low voltage segment includes LEDs with a CCT value that is equal to the intended minimum CCT value to be provided during dimming.

When dimming (such as phase cut dimming) is applied to such a configuration, more of the instantaneous power provided over a cycle is delivered to the low voltage segment including the minimum value CCT LEDs. Therefore, in some embodiments according to the invention, as the solid-state lighting apparatus is dimmed the emitted light may more closely approximate incandescent lighting when, for example, the minimum value CCT LEDs are "warm" in color such as that provided by LEDs having a CCT value of about 1800K or ccxy (0.55, 0.41).

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive subject matter. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that when an element is referred to as being "on" another element, the element can be directly on another element or intervening elements may also be present. In contrast, when an element is referred to as being "directly on" another element, there are no intervening elements present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the Figures. It will be understood that the spatially relative terms are intended to encompass different orientations of the device in use or operation, in addition to the orientation depicted in the Figures.

Embodiments of the inventive subject matter are described herein with reference to plan and perspective illustrations that are schematic illustrations of idealized embodiments of the inventive subject matter. As such, variations from the shapes of the illustrations as a result, for example, of manufacturing techniques and/or tolerances, are to be expected. Thus, the inventive subject matter should not be construed as limited to the particular shapes of objects illustrated herein, but should include deviations in shapes that result, for example, from manufacturing. Thus, the objects illustrated in the Figures are schematic in nature and their shapes are not intended to illustrate the actual shape of a region of a device and are not intended to limit the scope of the inventive subject matter.

The terminology used herein is for the purpose of describing particular embodiments only and is not intended to be limiting of the present inventive subject matter. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present inventive subject matter belongs. It will be further understood that terms used herein should be interpreted as having a meaning that is consistent with their meaning in the context of this specification and the relevant art and will not be interpreted in an idealized or overly formal sense unless expressly so defined herein. The term "plurality" is used herein to refer to two or more of the referenced item.

It will be understood that, as used herein, the term light emitting diode may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers.

In the drawings and specification, there have been disclosed typical preferred embodiments of the inventive subject matter and, although specific terms are employed, they are used in a generic and descriptive sense only and not for purposes of limitation, the scope of the inventive subject matter being set forth in the following claims.

What is claimed:

1. A dimmable solid state lighting apparatus comprising:

a plurality of light emitting diode (LED) segments including a first LED segment having a targeted minimum Correlated Color Temperature (CCT) value that is less than or equal to respective CCT values of all other LED segments in the plurality of LED segments, and wherein the first LED segment comprises a first forward bias voltage that is less than or equal to forward bias voltages of all other LED segments in the plurality of LED segments;

an LED segment selection circuit configured to selectively control current through the plurality of LED segments to provide an increasing portion of instantaneous power to the first LED segment relative to all the other LED segments while decreasing instantaneous power that is provided to ones of the other LED segments, to shift the light emitted by the apparatus towards the targeted minimum CCT value emitted by the first LED segment while simultaneously decreasing a brightness of light emitted by the apparatus responsive to increased dimming input indicating an increased dimming level of the apparatus so as to shift the light emitted by the apparatus from including the respective CCT values of all of the plurality of LED segments at a reduced level of dimming input to including primarily the targeted minimum CCT value of the first LED segment of the plurality of LED segments at an increased level of dimming input;

a rectified AC voltage signal input to the dimmable solid state lighting apparatus configured to receive a rectified AC voltage signal; and a voltage controlled current source that is coupled to the rectified AC voltage signal input and to the plurality of LED segments that regulates the current provided to the plurality of LED segments in response to a magnitude of the rectified AC voltage signal.

2. The apparatus of claim 1 wherein the plurality of LED segments are coupled to the LED segment selection circuit as separately controllable banks of LEDs.

3. The apparatus of claim 1 wherein each of the respective CCT values of the LED segments included in the plurality of LED segments is located substantially on a Planckian locus.

4. The apparatus of claim 3 wherein the LED segment selection circuit is configured to selectively control currents through the plurality of LED segments so that the light emitted by the apparatus substantially shifts to the targeted minimum CCT value while conforming to the Planckian locus responsive to the increased dimming input.

5. The apparatus of claim 1 wherein the plurality of LED segments are coupled in series to provide an LED string, wherein the LED segment selection circuit is configured to selectively switch a string current through combinations of the LED segments using a phase of a rectified ac input signal or a level of the rectified ac input signal.

6. The apparatus of claim 5 wherein a full CCT value for light output from the apparatus is defined as all LED segments on.

7. The apparatus of claim 6 wherein the LED segment selection circuit is configured to change the light output from the apparatus from the full CCT value to the targeted minimum CCT value responsive to the increased dimming input.

8. The apparatus of claim 7 wherein the LED segment selection circuit increasingly switches the LED string current through the first LED segment to provide the increasing portion of the instantaneous power from the rectified ac input signal over a cycle to the first LED segment responsive to the increased dimming input.

9. The apparatus of claim 1, wherein the reduced level of dimming input is a minimum dimming input for the apparatus, and wherein the increased level of dimming input is a maximum dimming input for the apparatus.

10. A dimmable solid state lighting apparatus comprising:

a plurality of light emitting diode (LED) segments including a first LED segment having a targeted minimum CCT value for light emitted from the apparatus, the targeted minimum CCT value being less than or equal to respective CCT values for all other LED segments included in the plurality of LED segments;

an LED segment selection circuit configured to selectively control current through the plurality of LED segments to shift the light emitted from the apparatus towards the targeted minimum CCT value of the first LED segment while simultaneously decreasing an intensity of light emitted by the apparatus responsive to increased dimming input indicating an increased dimming level of the apparatus;

a rectified AC voltage signal input to the dimmable solid state lighting apparatus configured to receive a rectified AC voltage signal; and a voltage controlled current source that is coupled to the rectified AC voltage signal input and to the plurality of LED segments that regulates the current provided to the plurality of LED segments in response to a magnitude of the rectified AC voltage signal.

11. The apparatus of claim 10 wherein the plurality of LED segments are coupled to the LED segment selection circuit as separately controllable banks of LEDs.

12. The apparatus of claim 10 wherein each of the respective CCT values of the LED segments included in the plurality of LED segments is located substantially on a Planckian locus.

13. The apparatus of claim 12 wherein the LED segment selection circuit is configured to selectively control currents through the plurality of LED segments so that the light emitted from the apparatus substantially shifts to the targeted minimum CCT value while conforming to the Planckian locus responsive to the increased dimming input.

14. The apparatus of claim 10 wherein the plurality of LED segments are coupled in series to provide an LED string, wherein the LED segment selection circuit is configured to selectively switch a string current through the LED segments to provide a full on CCT value for the light emitted from the apparatus and configured to increasingly switch the string current through the first LED segment to provide an increasing portion of power from a rectified ac input signal to the first LED segment to provide the targeted minimum CCT value for light emitted from the apparatus responsive to the increased dimming input.

15. The apparatus of claim 14 wherein the LED segment selection circuit is configured to selectively switch the string current through combinations of the LED segments using a phase of the rectified ac input signal or a level of the rectified ac input signal.

16. The apparatus of claim 15 wherein the full on CCT value for the light output from the apparatus is defined based on a combination of average on times for each of the LED segments.

17. The apparatus of claim 10, wherein shifting the light emitted from the apparatus towards the targeted minimum CCT value comprises selectively controlling current through the plurality of LED segments to provide current to the first LED segment having the targeted minimum CCT value for the light emitted from the apparatus and not provide current to the other LED segments included in the plurality of LED segments.

18. The apparatus of claim 10, wherein shifting the light emitted from the apparatus towards the targeted minimum CCT value comprises selectively controlling current through the plurality of LED segments to shift the light emitted from the apparatus to the targeted minimum CCT value provided by the first LED segment.

19. A solid state lighting circuit comprising:

a plurality of light emitting diode (LED) segments including a first LED segment having a minimum Correlated Color Temperature (CCT) value among respective CCT values for the plurality of LED segments; and an LED segment selection circuit configured to selectively control current through the plurality of LED segments to shift the light emitted from the solid state lighting circuit towards the minimum CCT value while simultaneously decreasing an intensity of light emitted from the solid state lighting circuit responsive to a dimming input, the solid state lighting circuit further comprising:

a plurality of capacitors, each being electrically connected in parallel with a respective one of the LED segments;

a plurality of blocking diodes, each being electrically connected in series between the LED segments;

a rectified AC voltage signal input to the solid state lighting circuit configured to receive a rectified AC voltage signal; and a voltage controlled current source that is coupled to the rectified AC voltage signal input and to the plurality of LED segments that regulates the current provided to the plurality of LED segments in response to a magnitude of the rectified AC voltage signal applied to the solid state lighting circuit.

20. The circuit of claim 19 wherein the plurality of LED segments are coupled to the LED segment selection circuit as separately controllable banks of LEDs.

21. The circuit of claim 19 wherein each of the respective CCT values of the LED segments included in the plurality of LED segments is located substantially on a Planckian locus.

22. The circuit of claim 21 wherein the LED segment selection circuit is configured to selectively control currents through the plurality of LED segments so that the light emitted from the circuit substantially shifts to the minimum CCT value while conforming to the Planckian locus responsive to the dimming input.

23. The circuit of claim 19 wherein the plurality of LED segments are coupled in series to provide an LED string, wherein the plurality of LED segments comprise separately biased LED segments including the first LED segment comprising a first forward bias voltage that is less than second and third forward bias voltages of second and third LED segments.

24. The circuit of claim 23 wherein a second CCT value of the second LED segment is greater than the minimum CCT value and a third CCT value of the third LED segment is greater than the second CCT value.

25. The circuit of claim 24 wherein the first LED segment includes at least one LED including phosphor configured to emit light having the minimum CCT value, wherein the second LED segment includes at least one LED including phosphor configured to emit light having the second CCT value, and wherein the third LED segment includes at least one LED including phosphor configured to emit light having the third CCT value.

26. The circuit of claim 23 wherein the minimum CCT value of the first LED segment comprises about ccxy (0.55, 0.41), a CCT value of the second LED segment comprises about ccxy (0.49, 0.42), and a CCT value of the third LED segment comprises about ccxy (0.43, 0.41).

27. The circuit of claim 23 wherein the minimum CCT value of the first LED segment comprises a predetermined dimmest light level provided by the plurality of LED segments;

wherein the third LED segment comprises a third CCT value that is less than a predetermined greatest light level provided by the plurality of LED segments; and wherein the second LED segment comprises a second CCT value that is about mid-point between the minimum CCT value and the third CCT value is about ccxy (0.43, 0.41).

28. The circuit of claim 23 wherein the LED segment selection circuit is configured to selectively switch a string current through the first LED segment to provide increased power through the first LED segment over a cycle of the rectified ac voltage signal, responsive to input from a dimmer circuit.

29. The circuit of claim 28 wherein the input from the dimmer circuit comprises a trailing edge phase cut dimmer input to provide the increased power at less than about 45 degrees of phase as the trailing edge phase cut dimmer input.

30. The circuit of claim 28 wherein the input from the dimmer circuit comprises a leading edge phase cut dimmer input to provide the increased power at greater than about 135 degrees of phase as the leading edge phase cut dimmer input.

31. The circuit of claim 28 wherein the rectified ac voltage signal is based on a 120 volt ac input signal and the separately biased LED segments comprise:

the second LED segment having the second forward bias voltage of about 40 volts;

the third LED segment having the third forward bias voltage of about 80 volts; and wherein the first LED segment has the first forward bias voltage of about 20 volts.

32. The circuit of claim 28 wherein the rectified ac voltage signal is based on a 230 volt ac input signal and the separately biased LED segments comprise:

the second LED segment having the second forward bias voltage of about 80 volts;

the third LED segment having the third forward bias voltage of about 80 volts;

a fourth LED segment having a fourth forward bias voltage of about 80 volts; and wherein the first LED segment has the first forward bias voltage of about 40 volts.

33. A method of operating a solid state lighting circuit including a plurality of light emitting diode (LED) segments including a targeted LED segment, the method comprising:

selectively switching current through the targeted LED segment while simultaneously decreasing a combined intensity of light emitted by the plurality of LED segments responsive to dimming input indicating an increased dimming level of the plurality of LED segments so as to shift a light emitted by the apparatus from including all of the plurality of LED segments at a reduced level of dimming input to including primarily the targeted LED segment of the plurality of LED segments at an increased level of dimming input, wherein the targeted LED segment has a targeted minimum CCT value that is less than or equal to respective CCT values for all other LED segments included in the plurality of LED segments, wherein the targeted LED segment has a targeted forward bias voltage that is less than or equal to forward bias voltages of all other LEDs segments in the plurality of LED segments, and wherein selectively switching the current through the targeted LED segment is performed by a voltage controlled current source and is responsive to a magnitude of a rectified AC voltage signal applied to the solid state lighting circuit.

34. The method of claim 33 wherein the plurality of LED segments comprise separately controllable banks of LEDs.

35. The method of claim 33 wherein each of the respective CCT values of the LED segments included in the plurality of LED segments is located substantially on a Planckian locus.

36. The method of claim 35 wherein selectively switching comprises selectively controlling currents through the plurality of LED segments so that light emitted by the circuit substantially shifts to the targeted minimum CCT value while conforming to the Planckian locus responsive to increased dimming input.

37. The method of claim 33 wherein the plurality of LED segments are coupled in series to provide an LED string, wherein selectively switching comprises switching a string current through combinations of the LED segments using a phase of a rectified ac input signal or a level of the rectified ac input signal.

38. A method of operating a solid state lighting circuit including a plurality of light emitting diode (LED) segments, the method comprising:

increasingly switching current through a minimum Correlated Color Temperature (CCT) LED segment included in the plurality of LED segments, the minimum CCT LED segment having a minimum CCT value that is less than or equal to respective CCT values for all other LED segments of the plurality of LED segments, while simultaneously decreasing an intensity of light emitted by the plurality of LED segments as dimming increases that shifts the light emitted by the plurality of LED segments towards the minimum CCT value of the minimum CCT LED segment, wherein increasingly switching the current through the minimum CCT LED segment is performed by a voltage controlled current source and is responsive to a magnitude of a rectified AC voltage signal applied to the solid state lighting circuit.

* * * * *